United States Patent
Lee et al.

(10) Patent No.: US 11,158,651 B2
(45) Date of Patent: Oct. 26, 2021

(54) VERTICAL MEMORY DEVICES

(71) Applicant: SAMSUNG ELECTRONICS CO., LTD., Suwon-si (KR)

(72) Inventors: Kyunghwan Lee, Hwaseong-si (KR); Kwangsoo Kim, Hwaseong-si (KR); Taehun Kim, Gwacheon-si (KR); Yongseok Kim, Suwon-si (KR); Kohji Kanamori, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 101 days.

(21) Appl. No.: 16/773,103

(22) Filed: Jan. 27, 2020

(65) Prior Publication Data

US 2020/0388632 A1 Dec. 10, 2020

(30) Foreign Application Priority Data

Jun. 10, 2019 (KR) .................. 10-2019-0067767

(51) Int. Cl.
- *H01L 29/792* (2006.01)
- *H01L 27/11582* (2017.01)
- *G11C 16/04* (2006.01)
- *G11C 5/02* (2006.01)

(52) U.S. Cl.
CPC .......... *H01L 27/11582* (2013.01); *G11C 5/02* (2013.01); *G11C 16/0466* (2013.01); *H01L 29/7926* (2013.01)

(58) Field of Classification Search
CPC ......... H01L 27/11565; H01L 27/11582; H01L 29/40117; H01L 29/7926
See application file for complete search history.

(56) References Cited

U.S. PATENT DOCUMENTS

| | | | |
|---|---|---|---|
| 8,482,049 B2* | 7/2013 | Son | H01L 29/7827 257/314 |
| 8,946,808 B2 | 2/2015 | Lee et al. | |
| 9,112,045 B2 | 8/2015 | Kim et al. | |
| 10,083,981 B2 | 9/2018 | Daycock et al. | |
| 2017/0062471 A1 | 3/2017 | Son et al. | |
| 2017/0263640 A1 | 9/2017 | Takashima et al. | |
| 2018/0240810 A1 | 8/2018 | Tsuda | |
| 2020/0402998 A1* | 12/2020 | Cho | H01L 29/7926 |

FOREIGN PATENT DOCUMENTS

JP     2011023586     2/2011

* cited by examiner

*Primary Examiner* — Jaehwan Oh
(74) *Attorney, Agent, or Firm* — F. Chau & Associates, LLC

(57) ABSTRACT

A vertical memory device includes gate electrodes on a substrate. The gate electrodes are spaced apart from each other in a vertical direction. A channel penetrates the gate electrodes and extends in the vertical direction. A tunnel insulation pattern is formed on an outer sidewall of the channel. A charge trapping pattern structure is formed on an outer sidewall of the tunnel insulation pattern adjacent the gate electrodes in a horizontal direction. The charge trapping pattern structure includes upper and lower charge trapping patterns. A blocking pattern is formed between the charge trapping pattern structure and each of the adjacent gate electrodes. An upper surface of the upper charge trapping pattern is higher than an upper surface of the adjacent gate electrode. A lower surface of the lower charge trapping pattern is lower than a lower surface of an adjacent gate electrode.

20 Claims, 27 Drawing Sheets

VERTICAL MEMORY DEVICES

CROSS-REFERENCE TO RELATED APPLICATION

This application claims priority under 35 USC § 119 to Korean Patent Application No. 10-2019-0067767, filed on Jun. 10, 2019 in the Korean Intellectual Property Office (KIPO), the disclosure of which is incorporated by reference in its entirety herein.

TECHNICAL FIELD

The present inventive concepts relate to vertical memory devices. More particularly, the present inventive concepts relate to vertical memory devices having vertical channels.

DISCUSSION OF RELATED ART

To increase the degree of integration of a vertical memory device, the size of each layer that is vertically stacked in the device may be reduced. However, there may be a process limit in scaling down the vertical memory device beyond a certain level.

SUMMARY

Exemplary embodiments of the present inventive concepts provide vertical memory devices having improved electrical characteristics.

According to an exemplary embodiment of the present inventive concepts, a vertical memory device includes gate electrodes on a substrate. The gate electrodes are spaced apart from each other in a vertical direction that is substantially perpendicular to an upper surface of the substrate. A channel penetrates the gate electrodes and extends in the vertical direction. A tunnel insulation pattern is formed on an outer sidewall of the channel. A charge trapping pattern structure is formed on an outer sidewall of the tunnel insulation pattern adjacent the gate electrodes in a horizontal direction that is substantially parallel to the upper surface of the substrate. The charge trapping pattern structure includes upper and lower charge trapping patterns. A blocking pattern is formed between the charge trapping pattern structure and each of the gate electrodes are adjacent to the blocking pattern. An upper surface of the upper charge trapping pattern is higher than an upper surface of a gate electrode adjacent to the charge trapping pattern structure. A lower surface of the lower charge trapping pattern is lower than a lower surface of a gate electrode adjacent to the charge trapping structure.

According to an exemplary embodiment of the present inventive concepts, a vertical memory device includes gate electrodes on a substrate. The gate electrodes are spaced apart from each other in a vertical direction that is substantially perpendicular to an upper surface of the substrate. A channel penetrates the gate electrodes and extends in the vertical direction. A tunnel insulation pattern is formed on an outer sidewall of the channel. A charge trapping pattern structure is formed on an outer sidewall of the tunnel insulation pattern adjacent the gate electrodes in a horizontal direction that is substantially parallel to the upper surface of the substrate. The charge trapping pattern structure includes upper and lower charge trapping patterns. A blocking pattern is formed between the charge trapping pattern structure and each of the gate electrodes are adjacent to the blocking pattern. The blocking pattern covers an upper surface and a lower surface of each of the gate electrodes.

According to an exemplary embodiment, a vertical memory device includes gate electrodes on a substrate. The gate electrodes are spaced apart from each other in a vertical direction that is substantially perpendicular to an upper surface of the substrate. A channel penetrates the gate electrodes and extends in the vertical direction. A tunnel insulation pattern is formed on an outer sidewall of the channel. The tunnel insulation pattern includes a protrusion that protrudes in a horizontal direction that is substantially parallel to the upper surface of the substrate. A charge trapping pattern structure is formed on an outer sidewall of the tunnel insulation pattern that is adjacent the gate electrodes in the horizontal direction. The charge trapping pattern structure includes upper and lower charge trapping patterns that are spaced apart from each other in the vertical direction by the protrusion of the tunnel insulation pattern. A blocking pattern has a concave shape toward each of the gate electrodes. The concave shape corresponds to the protrusion of the tunnel insulation pattern.

A vertical memory device in accordance with exemplary embodiments of the present inventive concepts may include a tunnel insulation pattern, a charge trapping pattern structure, and a blocking pattern sequentially formed on an outer sidewall of a channel that extends through gate electrodes and insulation patterns alternately and repeatedly formed in a vertical direction substantially perpendicular to an upper surface of a substrate, and the charge trapping pattern structure may include upper and lower charge trapping patterns spaced apart from each other in the vertical direction.

Accordingly, a plurality of charge trapping patterns may be arranged in one transistor, so that the integration degree of the vertical memory device including the transistor may be improved, and electrons may be efficiently injected through the plurality of charge trapping patterns, so that the electrical characteristic of the vertical memory device may be improved.

BRIEF DESCRIPTION OF TIE DRAWINGS

DETAILED DESCRIPTION OF THE EXEMPLARY EMBODIMENTS

Vertical memory devices and methods of manufacturing the same in accordance with exemplary embodiments of the present inventive concepts will be described more fully hereinafter with reference to the accompanying drawings.

Figure 1:
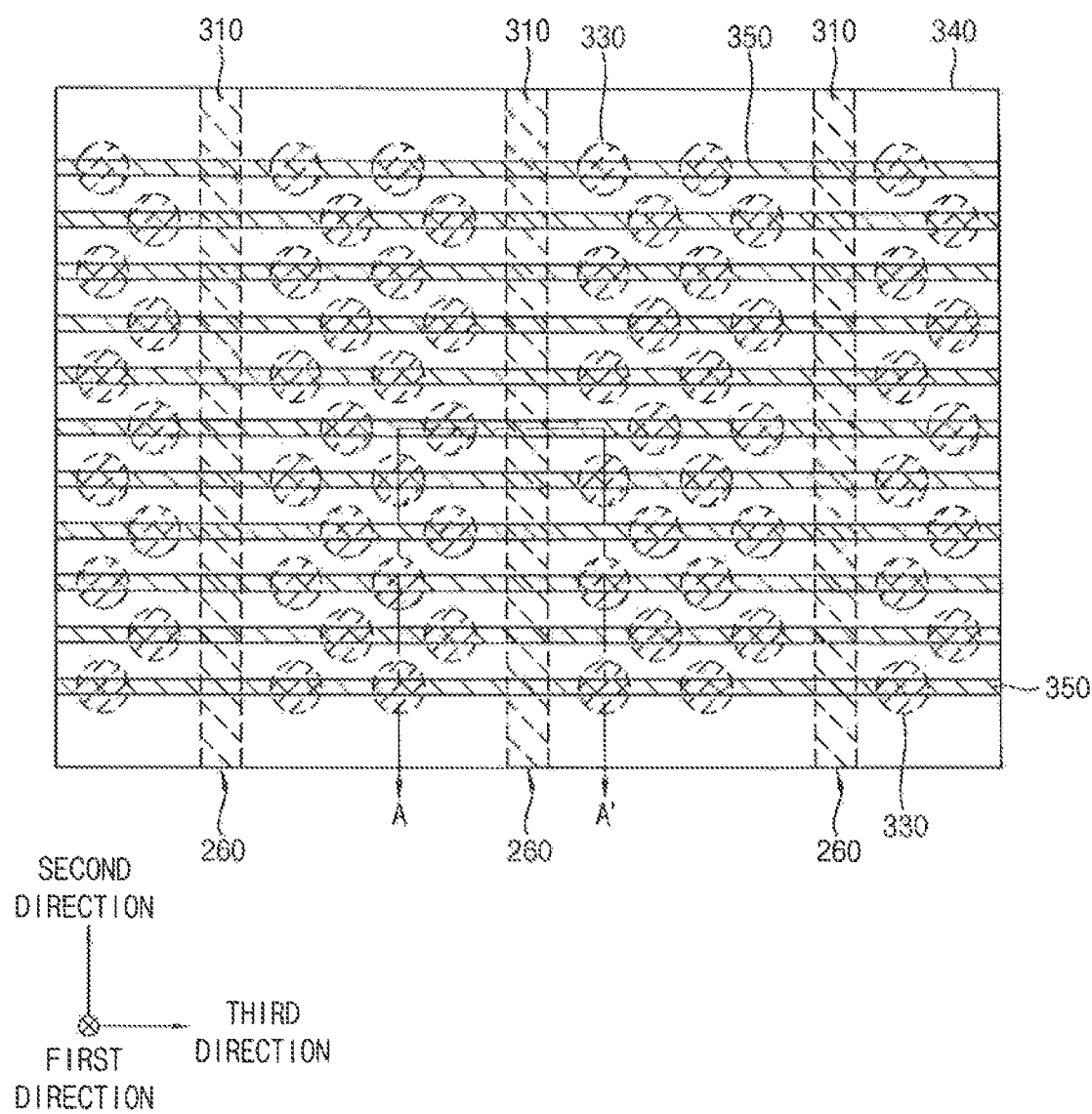
FIG. 1 is a plan view illustrating a vertical memory device in accordance with an exemplary embodiment of the present inventive concepts.
Figure 2:
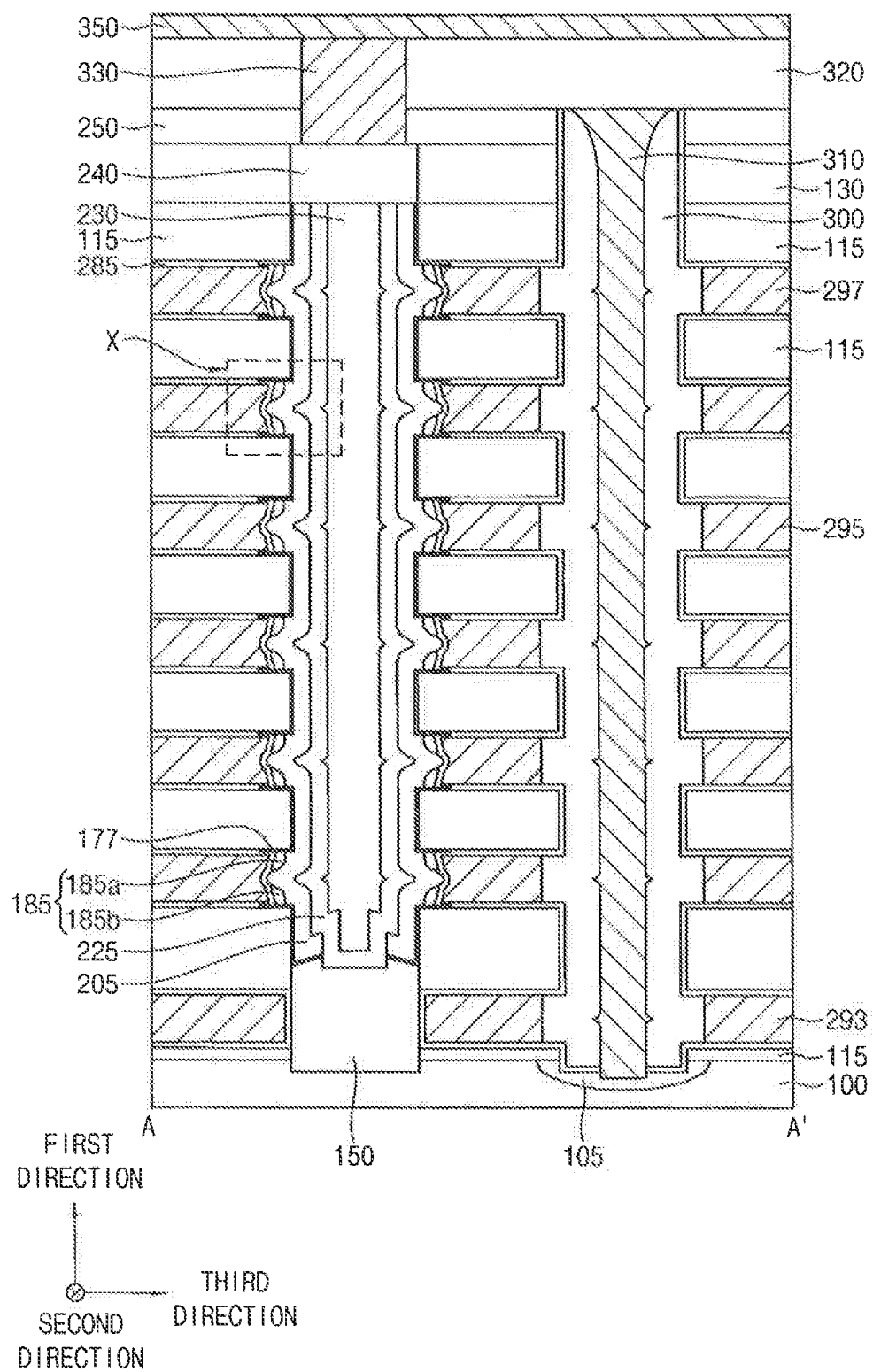
FIG. 2 is a cross-sectional view taken along line A-A' of FIG. 1 illustrating a vertical memory device in accordance with an exemplary embodiment of the present inventive concepts.
Figure 3:
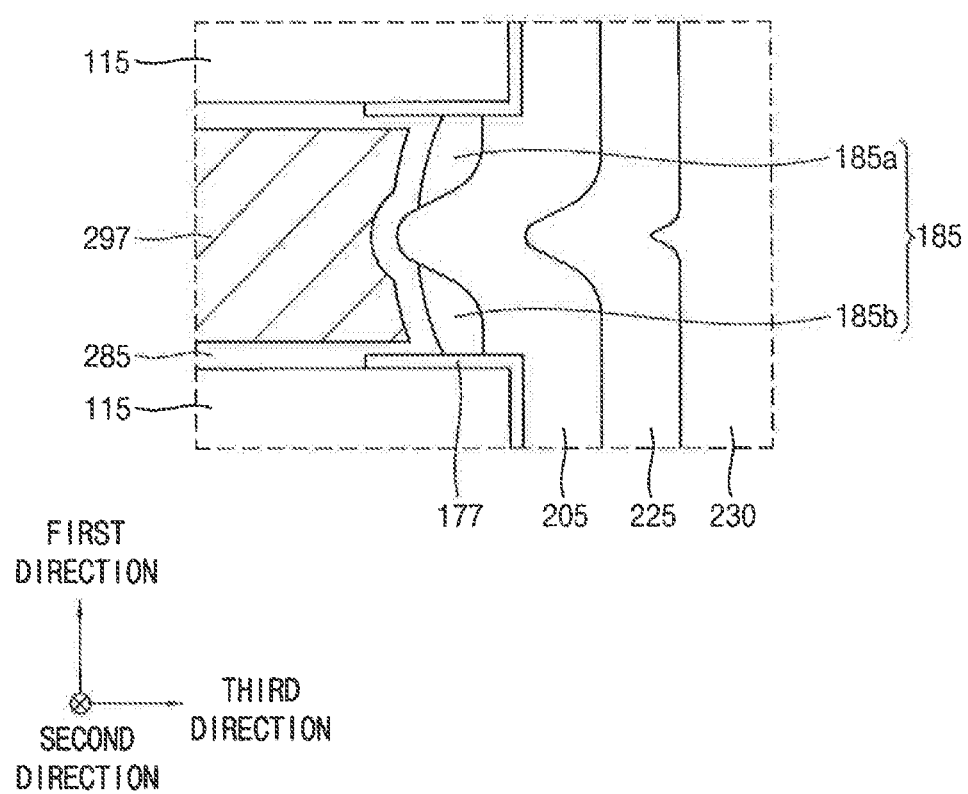
FIG. 3 is an enlarged cross-sectional view of region X in FIG. 2 in accordance with an exemplary embodiment of the present inventive concepts.

FIG. 1 is a plan view illustrating a vertical memory device in accordance with an exemplary embodiment of the present inventive concepts. FIG. 2 is a cross-sectional view taken along a line A-A' of FIG. 1 illustrating a vertical memory device in accordance with an exemplary embodiment of the present inventive concepts. FIG. 3 is an enlarged cross-sectional view of a region X in FIG. 2 in accordance with an exemplary embodiment of the present inventive concepts.

Hereinafter, a vertical direction substantially perpendicular to an upper surface of a substrate is defined as a first direction, and two directions intersecting with each other among horizontal directions substantially parallel to the upper surface of the substrate are defined as second and third directions, respectively. As shown in the exemplary embodiment of FIG. 1, the second direction and third direction may be orthogonal to each other.

Referring to FIGS. 1 to 3, the vertical memory device may include insulation patterns 115, gate electrodes, a channel 225, a tunnel insulation pattern 205, a charge trapping pattern structure 185, and a first blocking pattern 177 on a substrate 100. The vertical memory device may further include a semiconductor pattern 150, a buried pattern 230, a pad 240, a second blocking pattern 285, a second spacer 300, a common source line (CSL) 310, first to fourth insulating interlayers 130, 250, 320 and 340, a contact plug 330, and a bit line 350.

In an exemplary embodiment, the substrate 100 may include silicon, germanium, silicon-germanium or III-V compounds such as GaP, GaAs, GaSb, etc. In some exemplary embodiments, the substrate 100 may be a silicon-on-insulator (SOI) substrate or a germanium-on-insulator (GOI) substrate. However, exemplary embodiments of the present inventive concepts are not limited thereto.

The insulation patterns 115 may be formed on a plurality of levels along the first direction, and may be spaced apart from each other. For example, the insulation patterns may have different distances in the first direction between an upper surface of the substrate 100 and a bottom surface of the insulation pattern and such distances may be referred to as levels. The insulation patterns 115 may have different thicknesses along the first direction depending on the formed levels. For example, the insulation pattern 115 formed on a lowermost level from atop surface of the substrate 100 along the first direction may have the smallest thickness. The insulation pattern 115 formed on a second level from the top surface of the substrate may have the greatest thickness. The uppermost insulation pattern 115 formed on an uppermost level (e.g., the eight insulating pattern of FIG. 2 which has the greatest distance between the bottom surface of the insulation pattern and the top surface of the substrate in the first direction) may have the second greatest thickness. Each of the insulation patterns 115 formed on remaining middle levels between the insulation pattern 115 formed on the uppermost level and the insulation pattern formed on the lowermost level (e.g., the second to seventh insulation patterns shown in the exemplary embodiment of FIG. 2) may have a third greatest thickness. The insulation patterns on the middle levels may have a substantially similar thickness (e.g., length in the first direction). However, exemplary embodiments of the present inventive concepts are not limited thereto and the thicknesses of the insulation patterns may have different arrangements in other exemplary embodiments. Furthermore, the number of insulation patterns in the exemplary embodiment of FIG. 2 is not limiting and may vary in other exemplary embodiments.

Each of the gate electrodes may be formed between the insulation patterns 115 (e.g., in the third direction). The gate electrodes may be formed on a plurality of levels and are spaced apart from each other (e.g., in the first direction). For example, as shown in the exemplary embodiment of FIG. 2, the insulation patterns 115 and the gate electrodes may be alternately and repeatedly stacked in the first direction on the substrate 100. Each of the gate electrodes may extend in the second direction, and a plurality of gate electrodes may be arranged in the third direction and may be spaced apart from each other. Each of the gate electrodes extending in the second direction may be spaced apart from each other in the third direction by a second spacer 300 and the CSL 310 formed in a second opening 260.

The gate electrodes may include first to third gate electrodes 293, 295 and 297 sequentially formed along the first direction. In an exemplary embodiment, the first gate electrode 293 may serve as a ground selection line (GSL), the second gate electrodes 295 may serve as a word line, and the third gate electrode 297 may serve as a string selection line (SSL). Each of the first to third gate electrodes 293, 295 and 297 may be formed on one level or a plurality of levels. Furthermore, one or more dummy word lines may be further formed between the first and second gate electrodes 293 and 295 and/or between the second and third gate electrodes 295 and 297.

In the exemplary embodiment shown in FIG. 2, the first gate electrode 293 may be formed on a lowermost level (e.g., the smallest distance between the bottom surface of the electrode and an upper surface of the substrate 100 in the first direction), the third gate electrode 297 may be formed on an uppermost level and one level thereunder, and the second gate electrode 295 may be formed on a plurality of levels between the first gate electrode 293 and the third gate electrode 297 (e.g., the second to fifth levels in the exemplary embodiment of FIG. 2). Accordingly, the first gate electrode 293 may be formed adjacent to the semiconductor pattern 150 (e.g., in the third direction), and each of the second and third gate electrodes 295 and 297 may be formed adjacent to the channel 225 (e.g., in the third direction).

In an exemplary embodiment, the first gate electrode 293 may include a first gate conductive pattern and a first gate barrier pattern covering upper and lower surfaces (e.g., in the first direction) of the first gate conductive pattern and a portion of a sidewall of the first gate conductive pattern. The second gate electrode 295 may include a second gate conductive pattern and a second gate barrier pattern covering upper and lower surfaces (e.g., in the first direction) of the second gate conductive pattern and a portion of a sidewall of the second gate conductive pattern. The third gate electrode 297 may include a third gate conductive pattern and a third gate barrier pattern covering upper and lower surfaces (e.g., in the first direction) of the third gate conductive pattern and a portion of a sidewall of the third gate conductive pattern.

The upper surface, the lower surface and the sidewall adjacent to the channel 225 of each of the gate electrodes may be covered by the second blocking pattern 285. The second blocking pattern 285 may also cover a portion of a sidewall of each of the insulation patterns 115, a sidewall of each of the first and second insulating interlayers 130 and 250, and a portion of the upper surface of the substrate 100.

In an exemplary embodiment, the sidewall of each of the second and third gate electrodes 295 and 297 closest to the channel (e.g., and opposing the channel) in the third direction may have a concave shape or a convex shape toward the channel 225 as a whole.

The channel 225 may extend in the first direction on the semiconductor pattern 150 formed on the upper surface of the substrate 100, and may extend through the insulation patterns 115, and the second and third gate electrodes 295 and 297 alternately and repeatedly stacked.

In an exemplary embodiment, the semiconductor pattern 150 may have a pillar shape, e.g., a cylindrical shape.

In an exemplary embodiment, the semiconductor pattern 150 may be formed such that an upper surface thereof is positioned in the first direction between an upper surface and a lower surface of the insulation pattern 115 formed on the second level that has the greatest thickness among the insulation patterns 115.

The channel 225 may extend through the insulation patterns 115 formed on the first gate electrode 293, and the second and third gate electrodes 295 and 297. In an exemplary embodiment, the channel 225 may have a cup shape, and an inner space of the cup shape may be filled with the buried pattern 230 having a pillar shape. Alternatively, the channel 225 may have a pillar shape, and the buried pattern 230 may not be formed.

A plurality of channels 225 may be formed in the second and third directions, and thus a channel array may be defined.

The tunnel insulation pattern 205 may have a cup shape having a central portion that surrounds an outer sidewall of the channel 225 and extends in the first direction and is penetrated. In an exemplary embodiment, an inner sidewall (e.g., adjacent the channel 225) and an outer sidewall (e.g., closest to the electrodes and insulation pattern 115) of a portion of the tunnel insulation pattern 205 formed between each of the insulation patterns 115 and the channel 225 may have a vertical slope (e.g., perpendicular) with respect to the upper surface of the substrate 100. However, in an exemplary embodiment, an inner sidewall and an outer sidewall of a portion of the tunnel insulation pattern 205 formed between each of the first to third gate electrodes 293, 295 and 297 and the channel 225 may at least partially have a slope that is not vertical (e.g., extending in the third direction D3), but varies with respect to the upper surface of the substrate 100.

The charge trapping pattern structure 185 including upper and lower charge trapping patterns 185a and 185b may be formed between the second blocking pattern 285 that covers an outer sidewall of the tunnel insulation pattern 205 and the sidewall of each of the gate electrodes. The first blocking pattern 177 having a thin thickness may be formed between the charge trapping pattern structure 185 and the insulation patterns 115 formed thereon and thereunder (e.g., in the first direction). In one exemplary embodiment, the outer sidewall of the tunnel insulation pattern 205 may further protrude from an outer sidewall of each of the upper and lower charge trapping patterns 185a and 185b in the third direction toward the gate electrode. For example, as shown in the exemplary embodiment of FIG. 2, the middle portion of the tunnel insulation pattern 205 (e.g., in the first direction) may protrude from the outer sidewall.

In exemplary embodiments, the lowermost first blocking pattern in the first direction may partially cover a surface of the insulation pattern 115 that has the greatest thickness on the second level and the upper surface of the semiconductor pattern 150. The uppermost first blocking pattern 177 in the first direction may partially cover a surface of the insulation pattern 115 that has the second greatest thickness on the uppermost level and a lower surface of the pad 240. The remaining first blocking patterns 177 may partially cover surfaces of the insulation patterns 115 on the remaining levels. For example, the first blocking patterns 177 may cover an outer sidewall of the insulation patterns 115 which extend in the first direction and a portion of the top and bottom surfaces of the insulation patterns adjacent thereto.

Each of the upper and lower charge trapping patterns 185a and 185b may have a sidewall that is not vertical (e.g., perpendicular), but varies (e.g., extends in the third direction) with respect to the upper surface of the substrate 100. Each of the upper and lower charge trapping patterns 185a and 185b may have a symmetrical shape along the first direction based on the outer sidewall of the tunnel insulation pattern 205 protruded from the channel 225. In an exemplary embodiment, an upper surface of the upper charge trapping pattern 185a contacting the first blocking pattern 177 and a lower surface of the lower charge trapping pattern 185b contacting the first blocking pattern 177 may have substantially the same width in the third direction.

In an exemplary embodiment, a thickness of the upper charge trapping pattern 185a in the third direction may gradually increase from the top toward the bottom, and a thickness of the lower charge trapping pattern 185b in the third direction may gradually decrease from the top toward the bottom.

In exemplary embodiments, the charge trapping pattern structure 185 may be disposed between the channel 225 and each of the second and third gate electrodes 295 and 297 (e.g., in the third direction). An outer sidewall of the upper charge trapping pattern 185a is exposed by a gap 270 during its formation (see, e.g., FIG. 14) may have a slope that gradually decreases toward the top, and an outer sidewall of the lower charge trapping pattern 185b exposed by the gap 270 during its formation may have a slope that gradually decreases toward the bottom.

In an exemplary embodiment, the upper and lower charge trapping patterns 185a and 185b may be formed on a space between each of the second and third gate electrodes 295 and 297 and the channel 225 (e.g., in the third direction). As shown in FIG. 3, the exemplary embodiment of the upper surface of the upper charge trapping pattern 185a may be higher (e.g., in the first direction) than upper surfaces of the second and third gate electrodes 295 and 297 adjacent thereto, and a lower surface of the lower charge trapping pattern 185b may be lower than lower surfaces of the second and third gate electrodes 295 and 297 adjacent thereto.

In an exemplary embodiment, the first blocking pattern 177 may include an oxide, such as silicon oxide, and each of the upper and lower charge trapping patterns 185a and 185b may include a nitride, such as silicon nitride. However, exemplary embodiments of the present inventive concepts are not limited thereto.

The first insulating interlayer 130 may be formed on a first structure that includes the charge trapping pattern structure 185, the tunnel insulation pattern 205 and the channel 225, and the uppermost insulation pattern 115 formed on the uppermost level, and the pad 240 may extend through the first insulating interlayer 130 to contact an upper surface of the first structure. The second insulating interlayer 250 may be formed on the first insulating interlayer 130 and the pad 240.

The second spacer 300 may be formed on a sidewall of the second opening 260 that extends through the insulation patterns 115 and the first to third gate electrodes 293, 295 and 297 to expose the upper surface of the substrate 100. The second spacer 300 may extend in the second direction. The CSL 310 may fill a remaining portion of the second opening 260.

The third insulating interlayer 320 may be formed on the second insulating interlayer 250, the CSL 310, the second spacer 300 and the second blocking pattern 285. The contact plug 330 may extend through the second and third insulating interlayers 250 and 320 to contact an upper surface of the contact plug 330. The bit line 350 may extend through the fourth insulating interlayer 340 to contact an upper surface of the contact plug 330. In exemplary embodiments, the bit line 350 may extend in the third direction, and a plurality of bit lines may be formed along the second direction.

As described above, the charge trapping pattern structure 185 formed between each of the second to third gate electrodes 295 and 297 among the gate electrodes and the channel 225 may include the upper and lower charge trapping patterns 185a and 185b spaced apart from each other along the first direction. Accordingly, a plurality of charge trapping patterns may be arranged in one transistor. Therefore, the integration degree of the vertical memory device including the transistor may be improved. Also, electrons may be efficiently injected into the second to third gate electrodes 295 and 297 through each of the upper and lower charge trapping patterns 185a and 185b. Accordingly, the electrical characteristics of the vertical memory device may be improved.

Since the second to third gate electrodes 295 and 297 and the insulation patterns 115 may be formed to have a concave-convex shape in the first direction as a whole, the charge trapping pattern structure 185 may be at least partially interposed between the second to third gate electrodes 295 and 297 along the first direction, so that the interference between neighboring second to third gate electrodes 295 and 297 may be minimized. Therefore, coupling between the second electrodes 295 serving as word lines may be reduced.

FIGS. 4 to 21 are cross-sectional views illustrating stages of a method of manufacturing a vertical memory device in accordance with exemplary embodiments of the present inventive concepts. FIGS. 4-7, 9, 11, 13, 14, 16, 18, 20 and 22-24 are cross-sectional views taken along the line A-A' of FIG. 1. FIGS. 8, 10, 12, 15, 17, 19, 21 and 25-29 are enlarged cross-sectional views of the region X of corresponding cross-sectional views, respectively.

Figure 4:
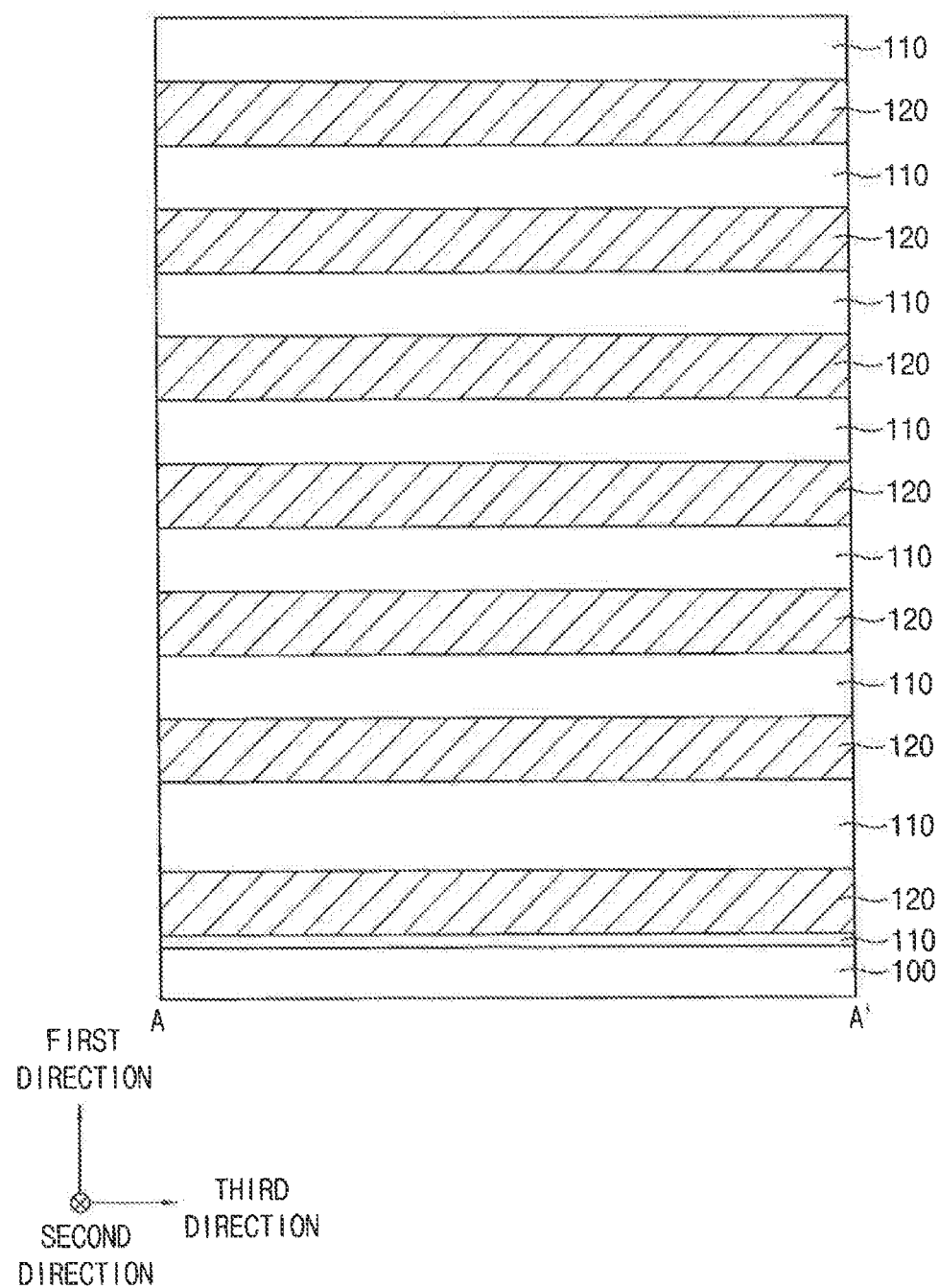
FIGS. 4-7, 9, 11, 13, 14, 16, 18 and 20 are cross-sectional views taken along line A-A' of FIG. 1 illustrating stages of a method of manufacturing a vertical memory device in accordance with exemplary embodiments of the present inventive concepts.

Referring to FIG. 4, insulation layers 110 and sacrificial layers 120 may be alternately and repeatedly stacked on a substrate 100 (e.g., in the first direction). Accordingly, a plurality of insulation layers 110 and a plurality of sacrificial layers 120 may be alternately stacked in the first direction. In the exemplary embodiment shown in FIG. 4, eight levels of insulation layers 110 and seven levels of sacrificial layers 120 are alternately formed on the substrate 100. However, exemplary embodiments of the present inventive concepts are not limited thereto and the number of the insulation layers 110 and the sacrificial layers 120 may be greater or less than that shown in the exemplary embodiment of FIG. 4.

In an exemplary embodiment, the insulation layers 110 and the sacrificial layers 120 may be formed by a chemical vapor deposition (CVD) process, a plasma enhanced chemical vapor deposition (PECVD) process, an atomic layer deposition (ALD) process, etc. In an exemplary embodiment, a lowermost insulation layer 110 formed directly on an upper surface of the substrate 100 may also be formed by a thermal oxidation process on the upper surface of the substrate 100.

The insulation layer 110 may include a silicon oxide, such as PE-TEOS, HDP oxide PEOX, etc. The sacrificial layer 120 may include a material having an etching selectivity with respect to the insulation layer 110, such as a silicon nitride. However, exemplary embodiments of the present inventive concepts are not limited thereto and the insulation layer 110 and sacrificial layer 120 may be formed of various other materials.

In exemplary embodiments, the lowermost insulation layer 110 formed on a first level in the first direction from the upper surface of the substrate 100 may have the smallest thickness (e.g., in the first direction) as compared with the insulation layer 110 at the other levels. An insulation layer 110 formed on a second level in the first direction from the upper surface of the substrate 100 may have the greatest thickness (e.g., in the first direction) as compared with the insulation layers 110 at the other levels.

Figure 5:
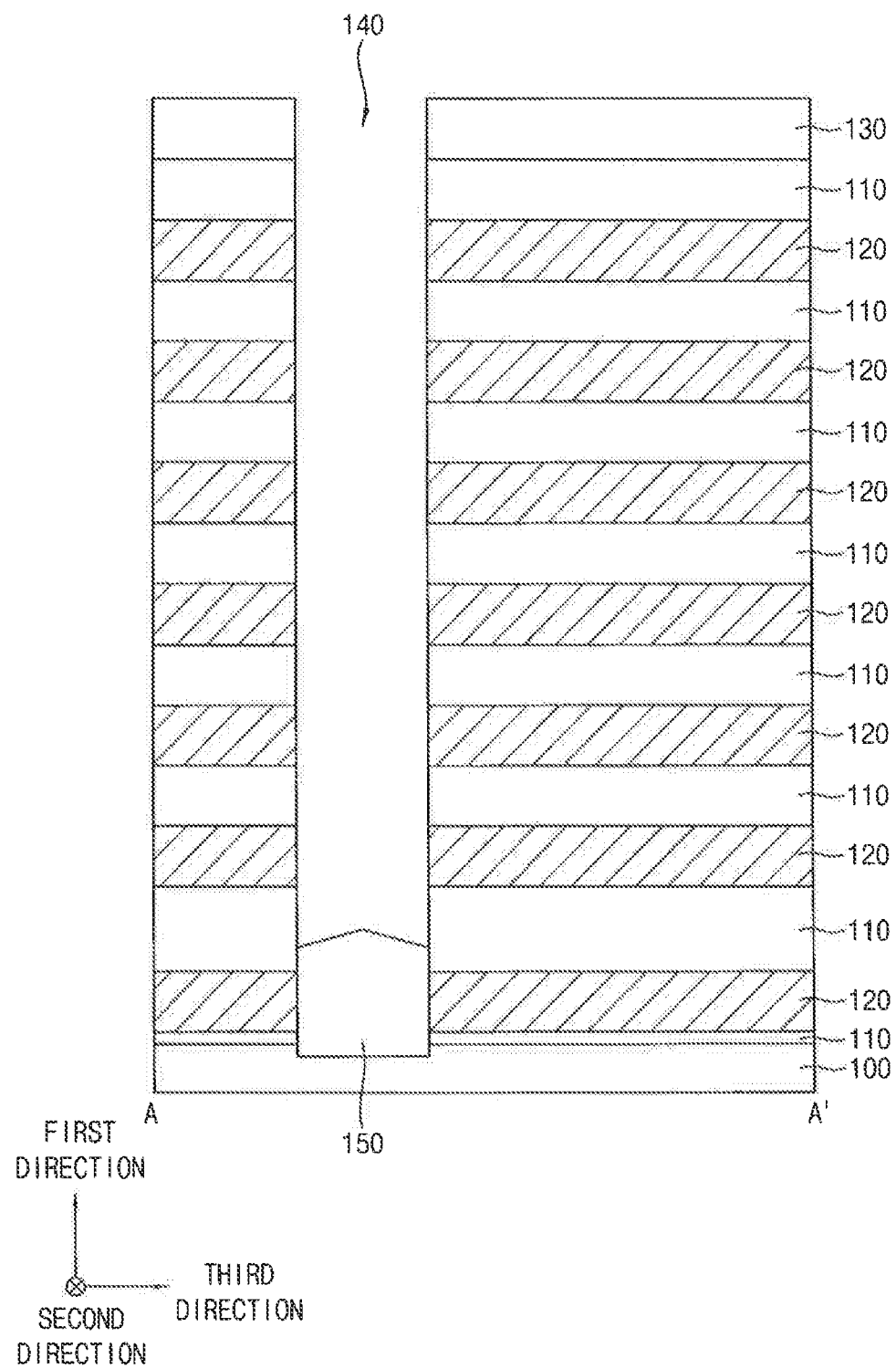

Referring to FIG. 5, after forming a first insulating interlayer 130 on an uppermost insulation layer 110, an etching process using an etching mask may be performed to etch the first insulating interlayer 130, the insulation layers 110 and the sacrificial layers 120 thereunder. A channel hole 140 extending through the first insulating interlayer 130, the insulation layers 110 and the sacrificial layers 120 may be formed to expose the upper surface of the substrate 100.

In an exemplary embodiment, the channel hole 140 may also partially extend through an upper portion of the substrate 100.

A semiconductor pattern 150 may be formed to partially fill the channel hole 140.

For example, in an exemplary embodiment, a selective epitaxial growth (SEG) process may be performed which uses the upper surface of the substrate 100 exposed by the channel hole 140 as a seed. The SEG process forms the semiconductor pattern 150 that may fill a lower portion of the channel hole 140. Accordingly, the semiconductor pattern 150 may include single crystalline silicon or single crystalline germanium according to the material of the substrate 100, and may be doped with impurities.

In another exemplary embodiment, the semiconductor pattern 150 may be formed by forming an amorphous silicon layer filling the channel hole 140, and performing a laser epitaxial growth (LEG) process or a solid phase epitaxy (SPE) process on the amorphous silicon layer.

In an exemplary embodiment, an upper surface of the semiconductor pattern 150 may be disposed between an upper surface and a lower surface of the insulation layer 110 on the second level among the insulation layers 110 (e.g., the second closest insulation layer in the first direction to an upper surface of the substrate 100).

The semiconductor pattern 150 may serve as a channel similar to a channel 225 (see FIG. 15) formed subsequently, and thus may be referred to as a lower channel.

Figure 6:
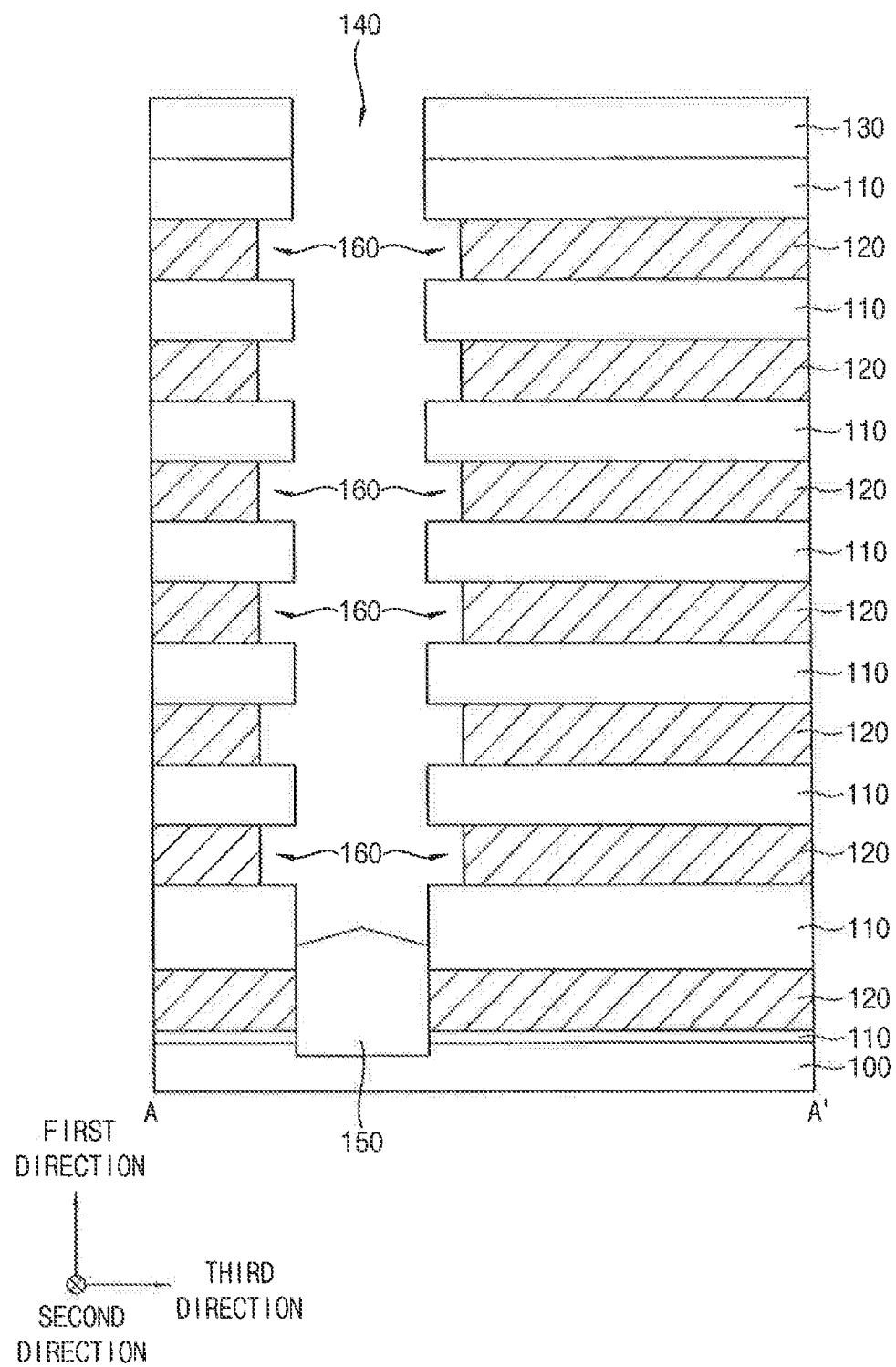

Referring to FIG. 6, sidewalls of the sacrificial layers 120 exposed by the channel hole 140 may be partially removed to form first recesses 160.

In an exemplary embodiment, the first recesses 160 may be formed by a dry etching process or a wet etching process.

In an exemplary embodiment, each of the first recesses 160 may be formed by partially removing each of the sacrificial layers 120 while maintaining a portion of the sacrificial layers. The first recesses 160 may have a depth in the third direction. Accordingly, the insulation layers 110 and the sacrificial layers 120 alternately and repeatedly stacked may have a concave-convex shape along the first direction as a whole.

In an exemplary embodiment, a first recess 160 may not be formed on a lowermost sacrificial layer 120. The lowermost sacrificial layer 120 may include a sidewall covered by the semiconductor pattern 150 formed on the lower portion of the channel hole 140. For example, as shown in the exemplary embodiment of FIG. 6, the semiconductor pattern 150 may have relatively planar sidewalls extending in the first direction and a constant width in the third direction at portions adjacent to the sacrificial layer 120.

Figure 7:
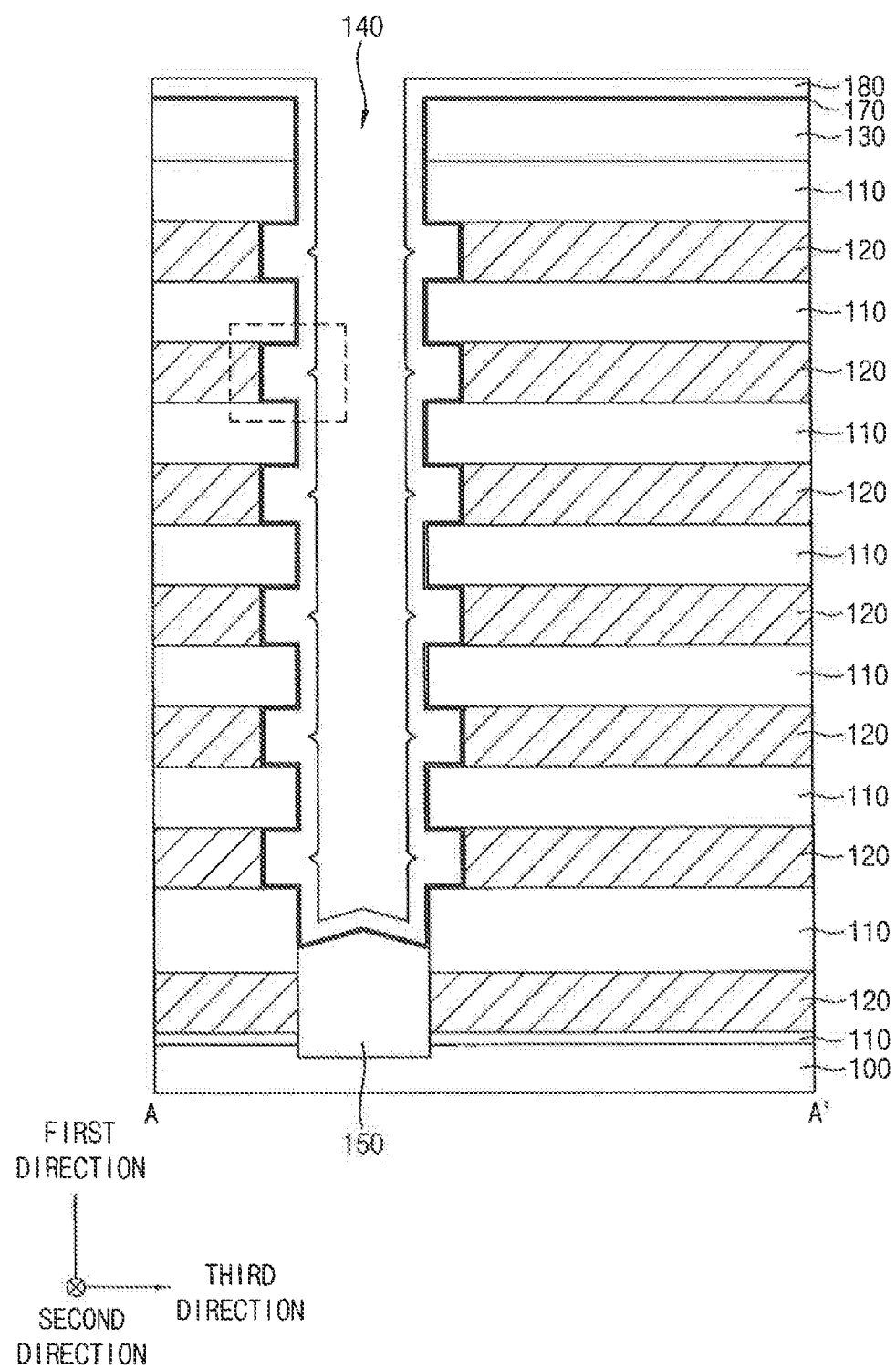
Figure 8:
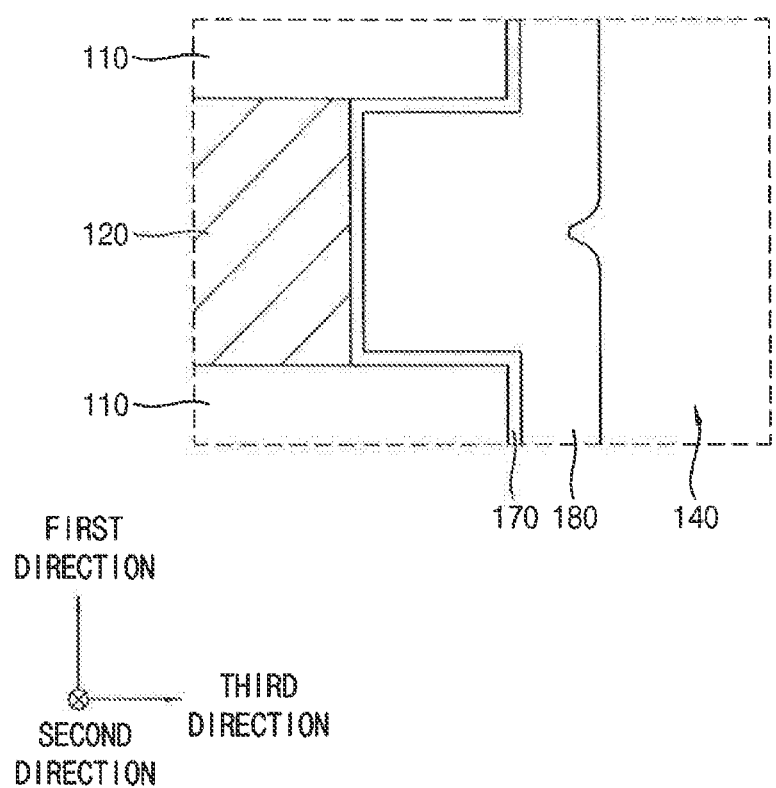
FIGS. 8, 10, 12, 15, 17, 19 and 21 are enlarged cross-sectional views illustrating stages of a method of manufacturing a vertical memory device in accordance with exemplary embodiments of the present inventive concepts.

Referring to FIGS. 7 and 8, a first blocking layer 170 and a charge trapping layer 180 may be sequentially formed on a sidewall of the channel hole 140, an inner sidewall of each of the first recesses 160, the upper surface of the semiconductor pattern 150 and an upper surface of the first insulating interlayer 130.

The first blocking layer 170 may be formed along surfaces of the insulation layers 110 and the sacrificial layers 120 that are alternately and repeatedly stacked, and a surface of the first insulating interlayer 130. For example, the first blocking layer 170 may be formed to cover sidewalls of the insulation layers 110 and the sacrificial layers 120 which extend in the first direction and a portion of the top and bottom surfaces of the insulation layers and sacrificial layers adjacent thereto which extend in the third direction. The first blocking layer 170 may be conformally formed to cover the inner sidewall of each of the first recesses 160 and to have a very small thickness. As the insulation layers 110 and the sacrificial layers 120 alternately and repeatedly stacked may have the concave-convex shape along the first direction as a whole, the first blocking layer 170 may also have a concave-convex shape along the first direction as a whole corresponding thereto.

The charge trapping layer 180 may be formed on the first blocking layer 170 and may be adjacent surfaces of the insulation layers 110 and the sacrificial layers 120 alternately and repeatedly stacked, and may fill each of the first recesses 160. A sidewall of a portion of the charge trapping layer 180 formed on the sidewall of the channel hole 140 may have a slope generally perpendicular with respect to the upper surface of the substrate 100 along the first direction. However, the sidewall of a portion of the charge trapping layer 180 may also have portions having a slope that is not vertical (e.g., perpendicular), but varies (e.g., extends in the third direction) with respect to the upper surface of the substrate 100 and may correspond to the shape of each of the first recesses 160. For example, in the exemplary embodiment shown in FIG. 7, a portion of the charge trapping layer 180 corresponding to a center portion of each of the first recesses 160 in the first direction may have a concave shape toward the channel hole 140 (e.g., a convex shape toward the sacrificial layer 120).

In an exemplary embodiment, the first blocking layer 170 may have a constant thickness, and each of the portions of the charge trapping layer 180 formed adjacent a sidewall of each of the insulation layers 110, the upper surface of the first insulating interlayer 130, and the upper surface of the semiconductor pattern 150 may also have a constant thickness. However, a portion of the charge trapping layer 180 adjacent to each of the first recesses 160 may not have a constant thickness, and may have a greater thickness than other portions thereof having the constant thicknesses.

The first blocking layer 170 may have an oxide, such as a silicon oxide, and the charge trapping layer 180 may have a nitride, such as a silicon nitride.

Figure 9:
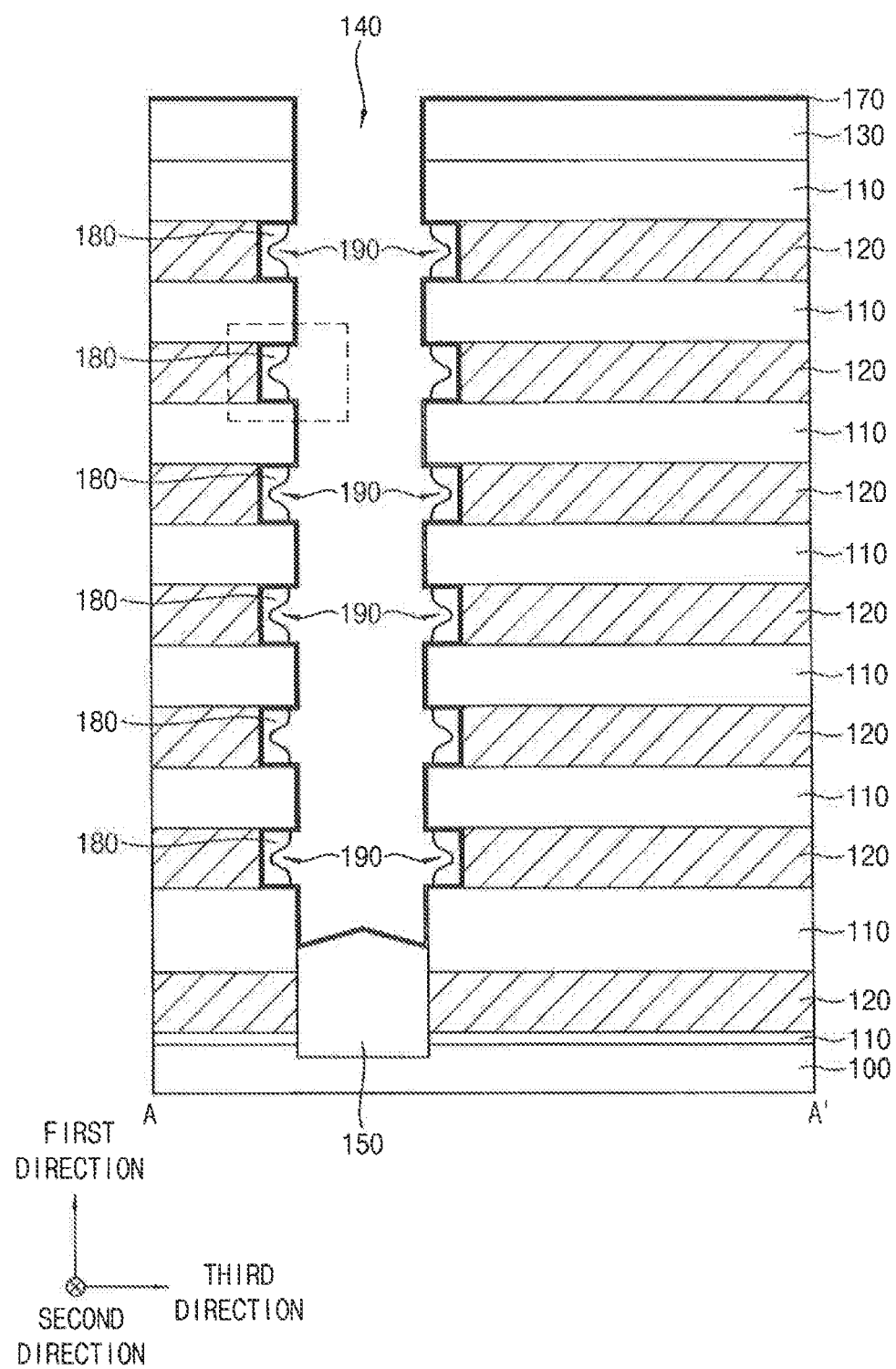
Figure 10:
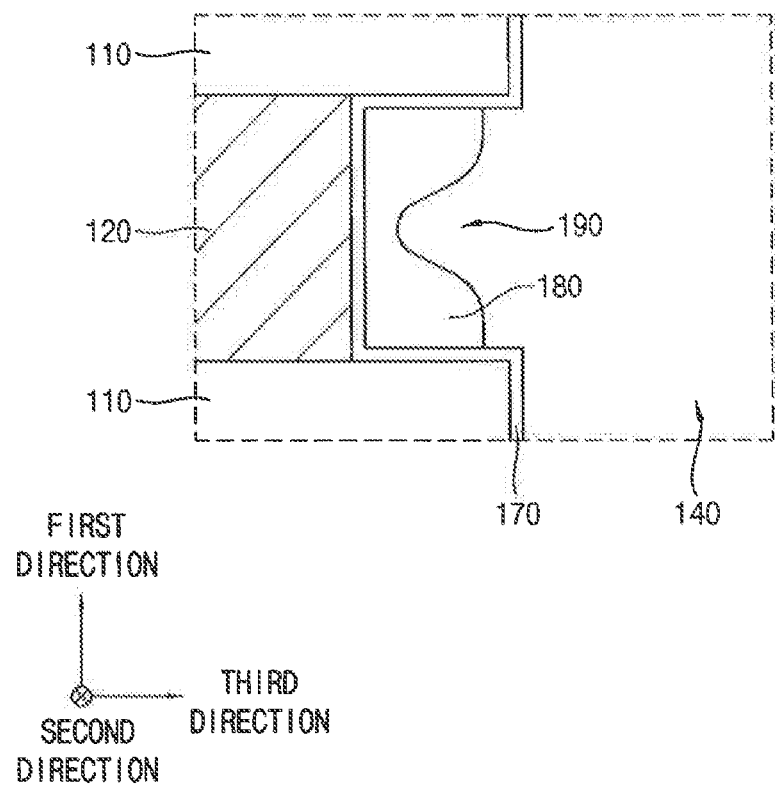

Referring to FIGS. 9 and 10, in an exemplary embodiment, the charge trapping layer 180 may be removed by a wet etching process or a dry etching process until a portion of the first blocking layer 170 formed on the sidewall of each of the insulation layers 110 may be exposed and the charge trapping layer 180 may remain only in each of the first recesses 160.

By performing the removing process, portions of the charge trapping layer 180 having relatively small thicknesses, such as the portions of the charge trapping layer 180 formed on the sidewall of each of the insulation layers 110, the upper surface of the first insulating interlayer 130, and the upper surface of the semiconductor pattern 150 may be completely removed. The portions of the charge trapping layer 180 having a relatively large thicknesses, such as the portions of the charge trapping layer 180 adjacent to each of the first recesses 160 may not be completely removed, but may partially remain. As the portion of the charge trapping layer 180 adjacent to each of the first recesses 160 may have a concave shape toward the channel hole 140, a second recess 190 having a concave shape toward the channel hole 140 may be formed on a sidewall of the remaining charge trapping layer 180 after the removing process.

In an exemplary embodiment, a width of the remaining charge trapping layer 180 in the third direction may vary along the first direction, and may gradually increase in portions closer to the adjacent insulation layers. For example, the portion in the middle of the charge trapping layer 180 in the first direction may have the smallest width in the third direction.

In the exemplary embodiment shown in FIGS. 9 and 10, the remaining charge trapping layer 180 is not separated by the second recess 190 along the first direction. However, exemplary embodiments of the present inventive concepts are not limited thereto. For example, in other exemplary embodiments, the remaining charge trapping layer 180 may be separated by the second recess 190 along the first direction and a surface of the first blocking layer 170 formed on the sidewall of each of the sacrificial layers 120 may be exposed by the second recess 190.

Figure 11:
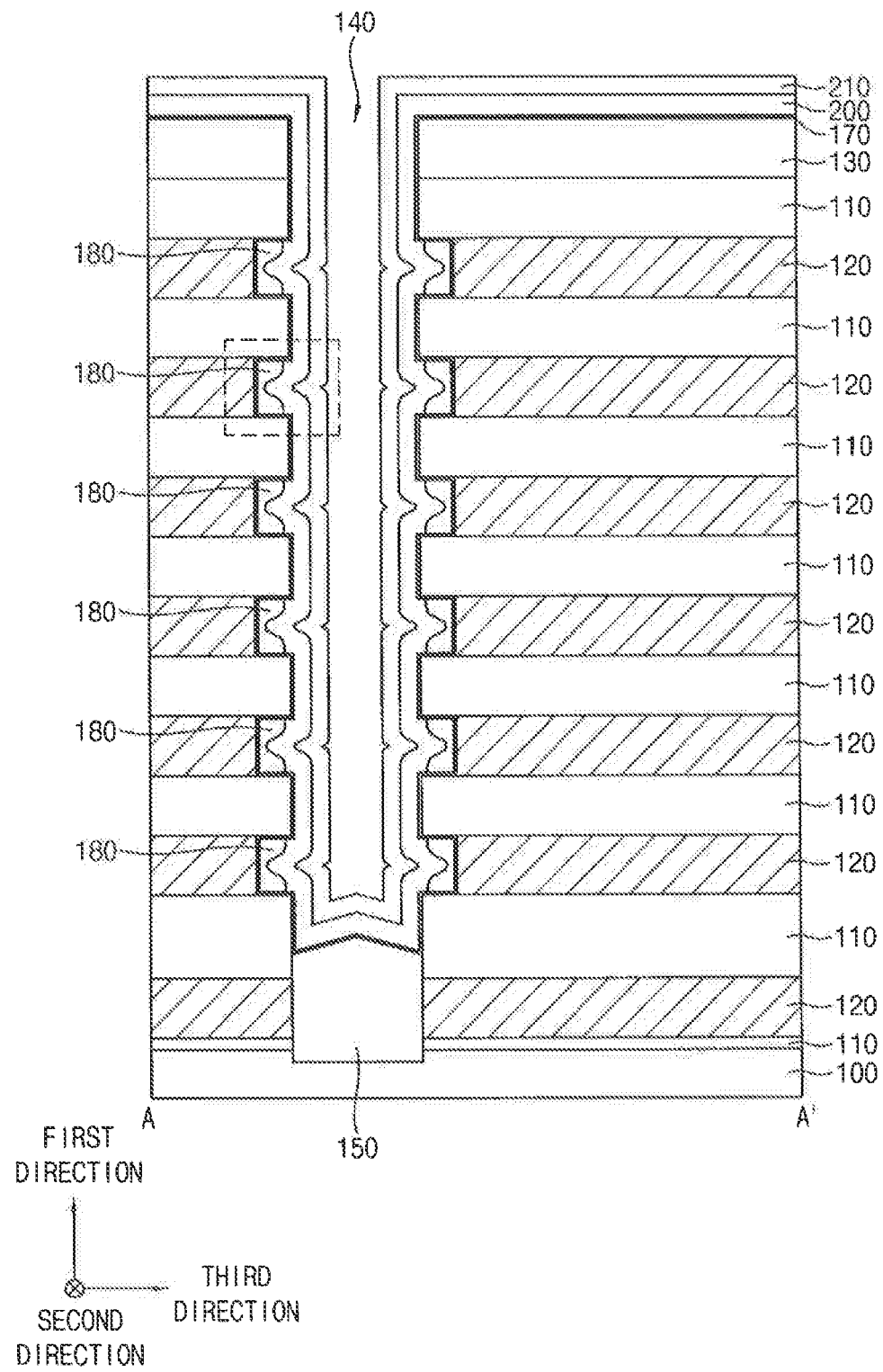
Figure 12:
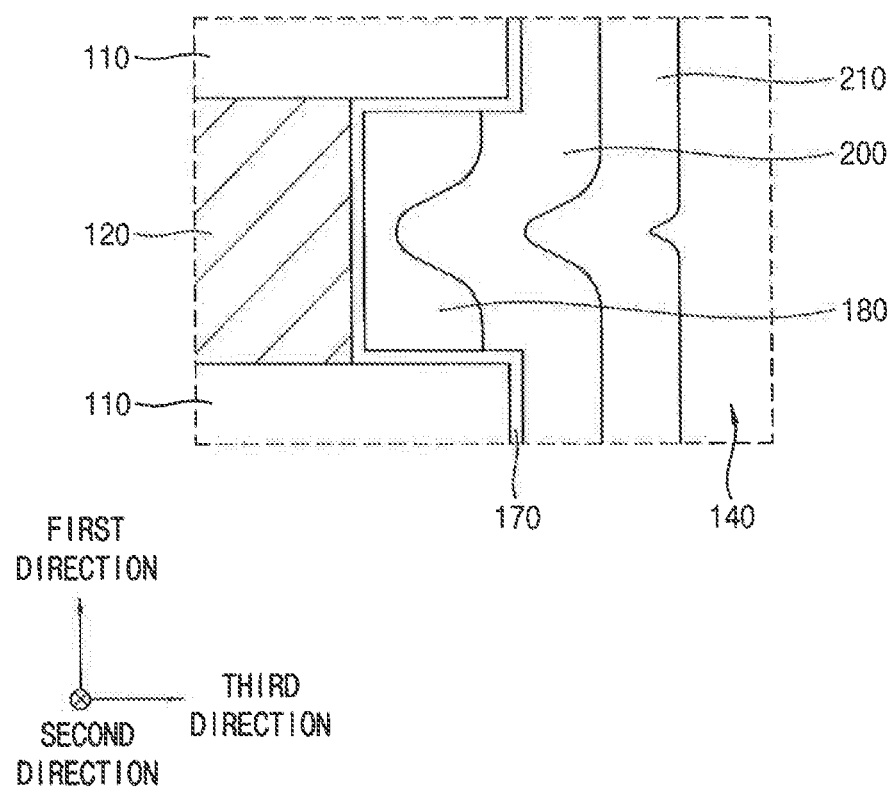

Referring to FIGS. 11 and 12, a tunnel insulation layer 200 and a first spacer layer 210 may be sequentially formed on the surface of the first blocking layer 170 and a surface of the charge trapping layer 180.

Each of sidewalls of the tunnel insulation layer 200 and the first spacer layer 210 may have a slope that is vertical (e.g., perpendicular) with respect to the upper surface of the substrate 100 along the first direction. However, each of sidewalls of portions of the tunnel insulation layer 200 and the first spacer layer 210 adjacent to the second recesses 190 may have a slope that is not vertical and which may vary (e.g., extend in the third direction) with respect to the upper surface of the substrate 100.

For example, in the exemplary embodiment shown in FIG. 11, the portions of the tunnel insulation layer 200 and the first spacer layer 210 adjacent to the second recesses 190 may have a concave shape in the third direction toward the channel hole 140. For example, the tunnel insulation layer 200 and the first spacer layer 210 adjacent to the second recesses 190 may have a convex shape in the third direction toward the sacrificial layers 120. The portion of the first spacer layer 210 may have a shape that is relatively less concave than the concave portion of the tunnel insulation layer 200.

In an exemplary embodiment, the tunnel insulation layer 200 may include, silicon oxide, etc., and the first spacer layer 210 may include, silicon nitride, etc.

Figure 13:
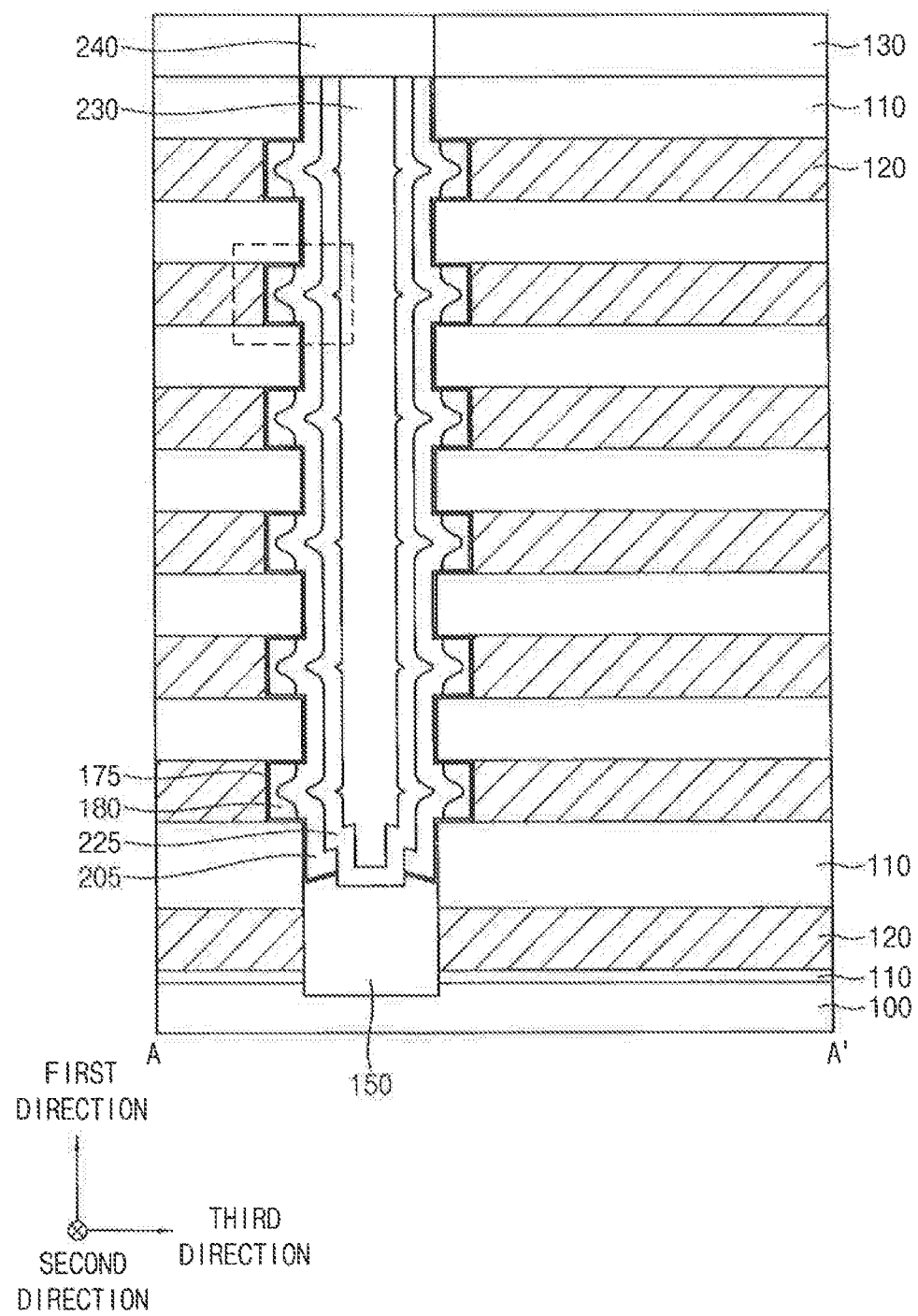

Referring to FIG. 13, the first spacer layer 210 may be anisotropically etched to form a first spacer that is formed only on the sidewall of the channel hole and exposes the tunnel insulation layer 200 under the first spacer layer 210. The tunnel insulation layer 200 and the first blocking layer 170 may be etched using the first spacer as an etching mask.

Accordingly, portions of the tunnel insulation layer 200 and the first blocking layer 170 on the upper surface of the semiconductor pattern 150, and portions of the tunnel insulation layer 200 and the first blocking layer 170 on the upper surface of the first insulating interlayer 130 may be removed, and an upper portion of the semiconductor pattern 150 may also be partially removed.

The etching process may convert the tunnel insulation layer 200 into a tunnel insulation pattern 205, and the first blocking layer 170 may be converted into a preliminary first blocking pattern 175. In an exemplary embodiment, each of the tunnel insulation pattern 205 and the preliminary first blocking pattern 175 may have a cup shape in which a central portion is penetrated. The charge trapping layer 180 may have a ring shape.

After removing the first spacer to expose the tunnel insulation pattern 205, a channel layer may be formed on the exposed tunnel insulation pattern 205, the semiconductor pattern 150 and the first insulating interlayer 130. A buried layer may be formed on the channel layer to sufficiently fill a remaining portion of the channel holes 140.

In an exemplary embodiment, the channel layer may include polysilicon doped or undoped with impurities, or amorphous silicon. In an exemplary embodiment in which the channel layer includes amorphous silicon, a laser epitaxial growth (LEG) process or a solid phase epitaxy (SPE) process may be further performed to convert amorphous silicon into crystalline silicon. The buried layer may include an oxide, such as silicon oxide, etc.

The buried layer and the channel layer may be planarized until the upper surface of the first insulating interlayer 130 may be exposed. A buried pattern 230 filling the remaining portion of each of the channel holes 140 may be formed, and the channel layer may be converted into a channel 225.

Accordingly, the preliminary first blocking pattern 175, the tunnel insulation pattern 205, the channel 225 and the buried pattern 230 may be sequentially stacked on the semiconductor pattern 150 in each of the channel holes 140. Each of the preliminary first blocking pattern 175 and the tunnel insulation pattern 205 may have a cup shape in which a central portion is penetrated. The channel 225 may have a cup shape and the buried pattern 230 may have a pillar shape.

A plurality of channels 225 may be formed in each of the second and third directions to form a channel array.

A charge trapping layer 180 may be formed on a sidewall of each of the sacrificial layers 120 adjacent to a sidewall of the channel 225 between the preliminary first blocking pattern 175 and the tunnel insulation pattern 205. The preliminary first blocking pattern 175, charge trapping layer 180, tunnel insulation pattern 205 and channel 225 may be spaced apart in the third direction.

The upper portions of the buried pattern 230, the channel 225, the tunnel insulation pattern 205 and the preliminary first blocking pattern 175 may be removed to form a trench, and a pad 240 may be formed to fill the trench.

For example, after removing each of the upper portions of the buried pattern 230, the channel 225, the tunnel insulation pattern 205 and the preliminary first blocking pattern 175 by an etch back process to form the trench, a pad layer filling the trench may be formed on the buried pattern 230, the channel 225, the tunnel insulation pattern 205, the preliminary first blocking pattern 175 and the first insulating interlayer 130. An upper portion of the pad layer may be planarized until the upper surface of the first insulating interlayer 130 may be exposed to form the pad 240. In an exemplary embodiment, the pad layer may include polysilicon doped with impurities or amorphous silicon. In an exemplary embodiment in which the pad layer includes amorphous silicon, a process for crystallizing the pad layer may be further performed.

Figure 14:
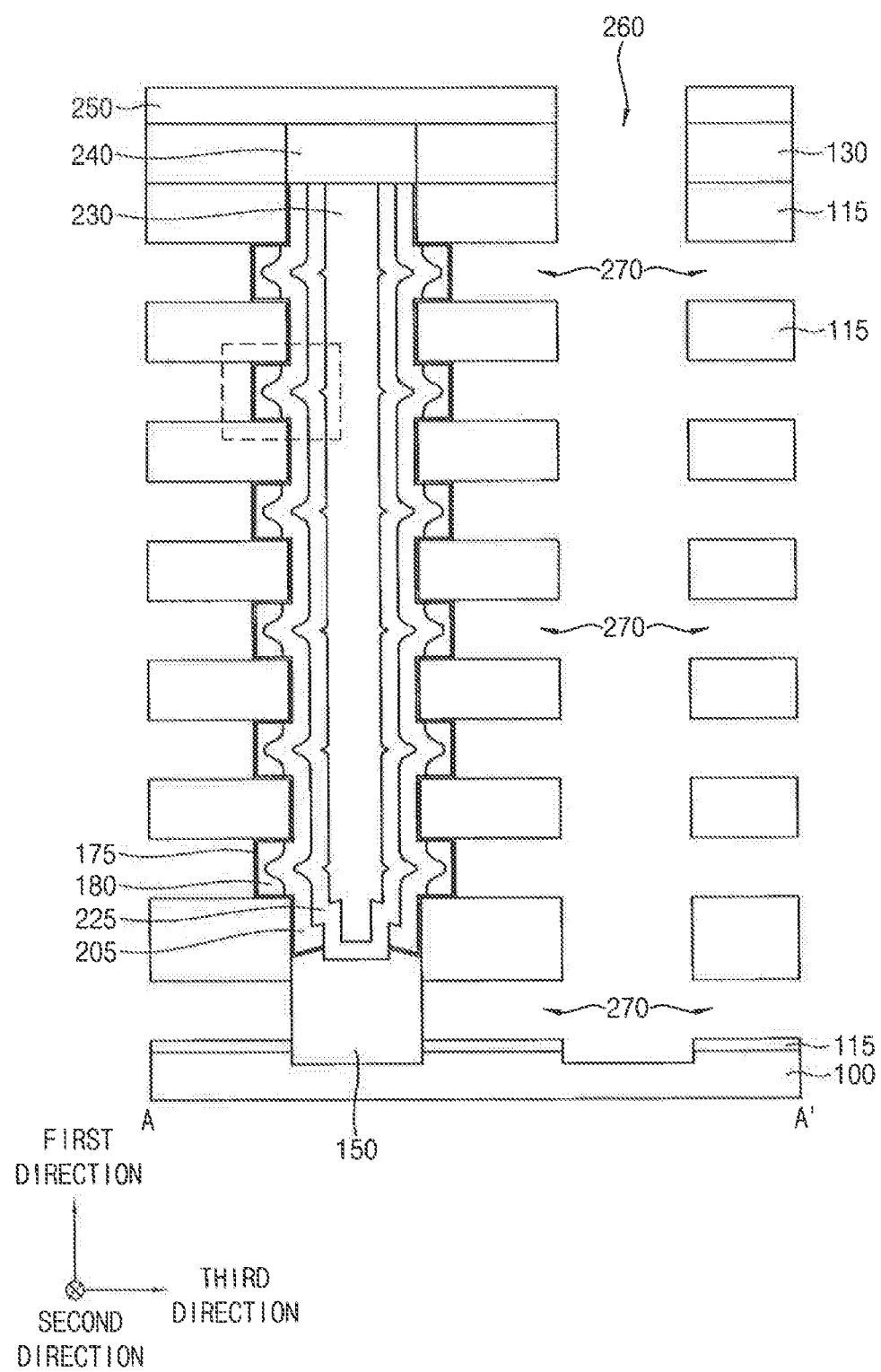
Figure 15:
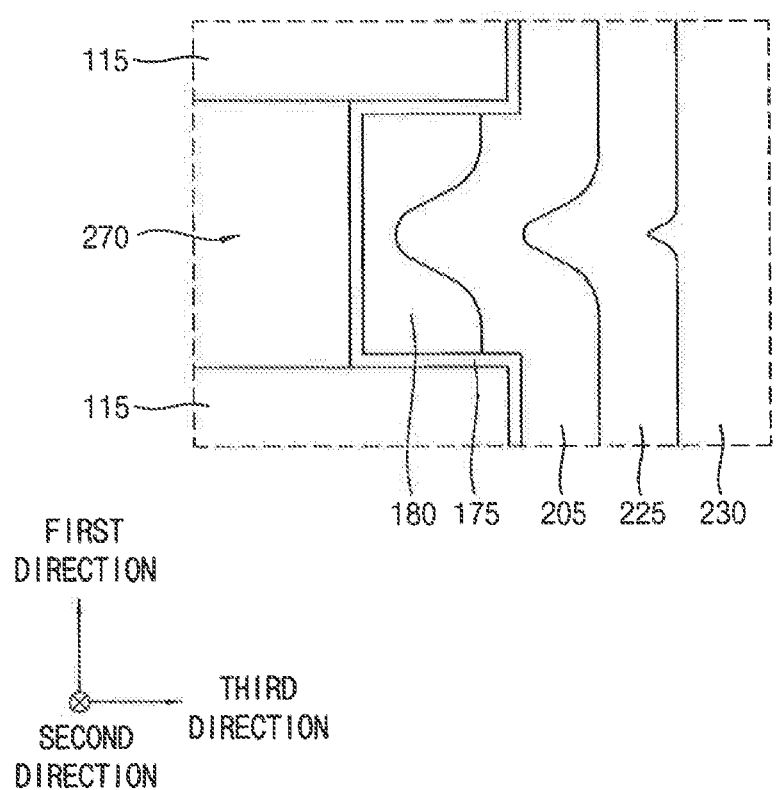

Referring to FIGS. 14 and 15, a second insulating interlayer 250 is formed on the upper surfaces (e.g., in the first direction) of the first insulating interlayer 130 and the pad 240. A second opening 260 extending through the first and second insulating interlayers 130 and 250, the insulation layers 110, and the sacrificial layers 120 may be formed to expose the upper surface of the substrate 100. In an exemplary embodiment, the second opening 260 is formed by performing an etching process using an etching mask. However, exemplary embodiments of the present inventive concepts are not limited thereto.

In an exemplary embodiment, the second opening 260 may extend in the second direction, and a plurality of second openings 260 may be formed along the third direction.

As the second opening 260 is formed, the insulation layer 110 may be converted into an insulation pattern 115, and the sacrificial layer 120 may be converted into a sacrificial pattern.

The sacrificial patterns exposed by the second opening 260 may be removed to form a gap 270 between the insulation patterns 115 of each level (e.g., in the first direction). A portion of an outer sidewall of the preliminary first blocking pattern 175 and a portion of a sidewall of the semiconductor pattern 150 may be exposed by the gap 270. In an exemplary embodiment, the sacrificial patterns exposed by the second opening 260 may be removed by a wet etching process using an etchant including phosphoric acid or sulfuric acid. However, exemplary embodiments of the present inventive concepts are not limited thereto.

Figure 16:
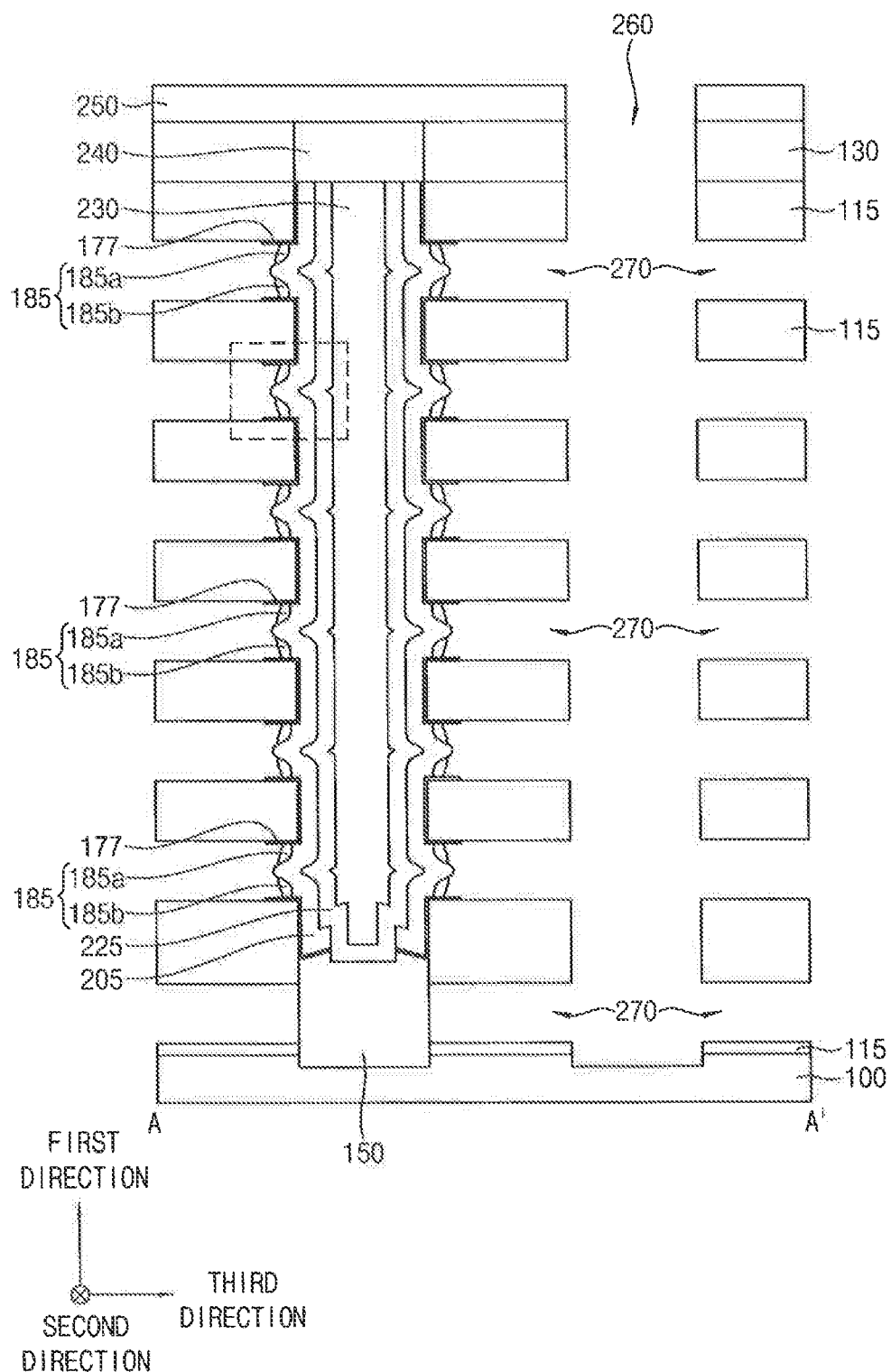
Figure 17:
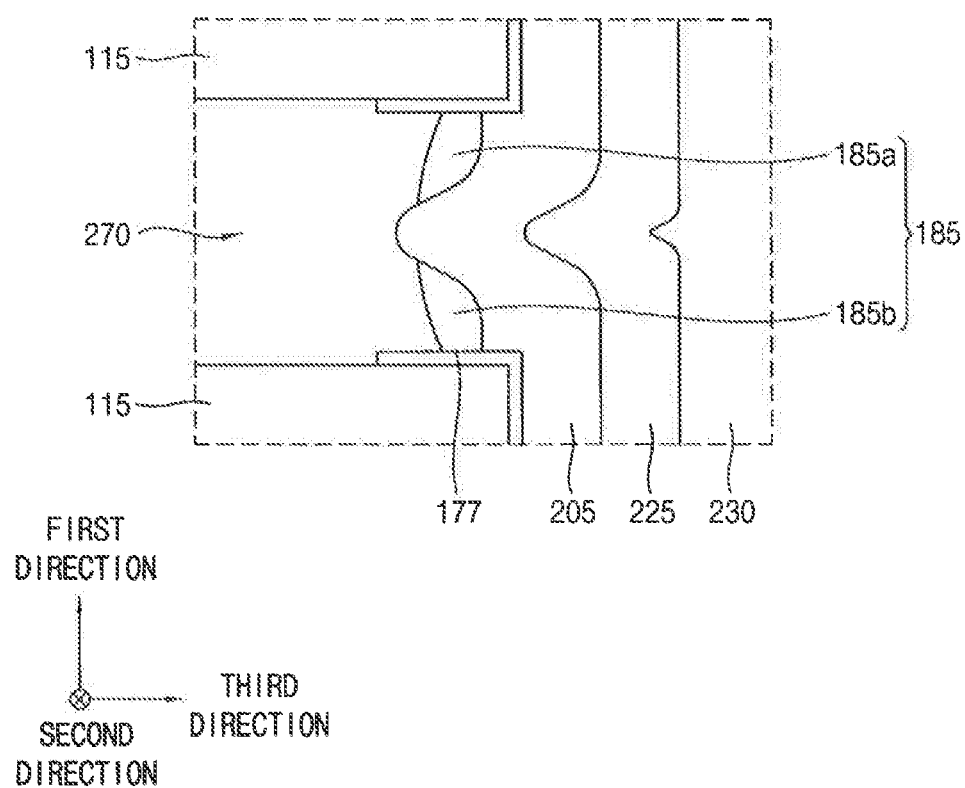

Referring to FIGS. 16 and 17, the preliminary first blocking pattern 175 exposed by the gap 270 may be etched to expose an outer sidewall (e.g., a sidewall farthest from the tunnel insulation pattern 205 in the third direction) of the charge trapping layer 180. The exposed outer sidewall of the charge trapping layer 180 may be partially etched. Accordingly, the preliminary first blocking pattern 175 may be converted into a first blocking pattern 177, and an upper portion and a lower portion of the charge trapping layer 180 may be separated and converted into a charge trapping pattern structure 185.

In an exemplary embodiment, the etching of the charge trapping layer 180 may be performed by a wet etching process to selectively etch nitride. Although the preliminary first blocking pattern 175 includes an oxide, the preliminary first blocking pattern 175 may have a very small thickness, and thus may be removed by the etching process. However, as a portion of the exposed preliminary first blocking pattern 175 that contacts each of the insulation patterns 115 may have a large thickness in a direction in which the etching process is performed, e.g., in the third direction, even though the portion of the exposed preliminary first blocking pattern 175 is partially removed by the etching process, portions may remain to form the first blocking pattern 177. A surface of the first blocking pattern 177 may be partially exposed by the gap 270.

In exemplary embodiments, a lowermost first blocking pattern 177 in the first direction may partially cover each of a surface of the insulation pattern 115 on the second level that may have the greatest thickness (e.g., in the first direction) and the upper surface of the semiconductor 150. An uppermost first blocking pattern 177 in the first direction may partially cover a surface of an uppermost insulation pattern 115 that may have a second greatest thickness and a lower surface of the pad 240. For example, the uppermost first blocking pattern 177 may cover a sidewall of the insulation pattern 115 on the eighth level and a portion of the lower surface of the pad 240. The first blocking pattern 177 on remaining middle levels may partially cover surfaces of the insulation patterns 115 on the remaining levels, respectively.

The etching process may be performed to remove the charge trapping layer 180 until an outer sidewall of the tunnel insulation pattern 205 (e.g., the sidewall farthest from the channel 225 in the third direction) may be partially exposed. Therefore, the charge trapping layer 180 may be separated in the first direction by the exposed outer sidewall of the tunnel insulation pattern 205 to form a charge trapping pattern structure 185. The charge trapping pattern structure 185 formed above (e.g., in the first direction) the exposed outer sidewall of the tunnel insulation pattern 205 may be referred to as an upper charge trapping pattern 185a, and the charge trapping pattern structure 185 formed under (e.g., in the first direction) the exposed outer sidewall of the tunnel insulation pattern 205 may be referred to as a lower charge trapping pattern 185b. The charge trapping pattern structure 185, the tunnel insulation pattern 205 and the channel 225 altogether may form a first structure. However, in other exemplary embodiments, three or more separated charge trapping patterns may be formed.

Each of the upper and lower charge trapping patterns 185a and 185b may have a sidewall that is not vertical (e.g., perpendicular), but varying with respect to the upper surface of the substrate 100 (e.g., extending in the third direction), and may have a symmetrical shape along the first direction based on the exposed outer sidewall of the tunnel insulation pattern 205. In an exemplary embodiment, an upper surface of the upper charge trapping pattern 185a contacting the first blocking pattern 177 and a lower surface of the lower charge trapping pattern 185b contacting the first blocking pattern 177 may have substantially the same width in the third direction.

In an exemplary embodiment, the extent of etching of the charge trapping layer 180 may be greater in portions that are closer to each of the insulation patterns 115 in the first direction. Accordingly, an outer sidewall of the upper charge trapping pattern 185a exposed by the gap 270 may have a slope that gradually decreases toward the top, and an outer sidewall of the lower charge trapping pattern 185b exposed by the gap 270 may have a slope that gradually decreases toward the bottom.

In exemplary embodiments, a thickness of the upper charge trapping pattern 185a in the third direction may gradually increase from the top toward the bottom, and a thickness of the lower charge trapping pattern 185b in the third direction may gradually decrease from the top toward the bottom.

In an exemplary embodiment, the exposed outer sidewall of the tunnel insulation pattern 205 may protrude from the channel 225 in the third direction more than the exposed outer sidewall of the charge trapping pattern structure 185. For example, as shown in the exemplary embodiment of FIG. 16, the exposed outer sidewall of the tunnel insulation pattern 205 may protrude greater from the channel 225 in the third direction than the exposed outer sidewall of the charge trapping pattern structure 185 in a middle portion (e.g., in the first direction) of the charge trapping pattern structure.

Figure 18:
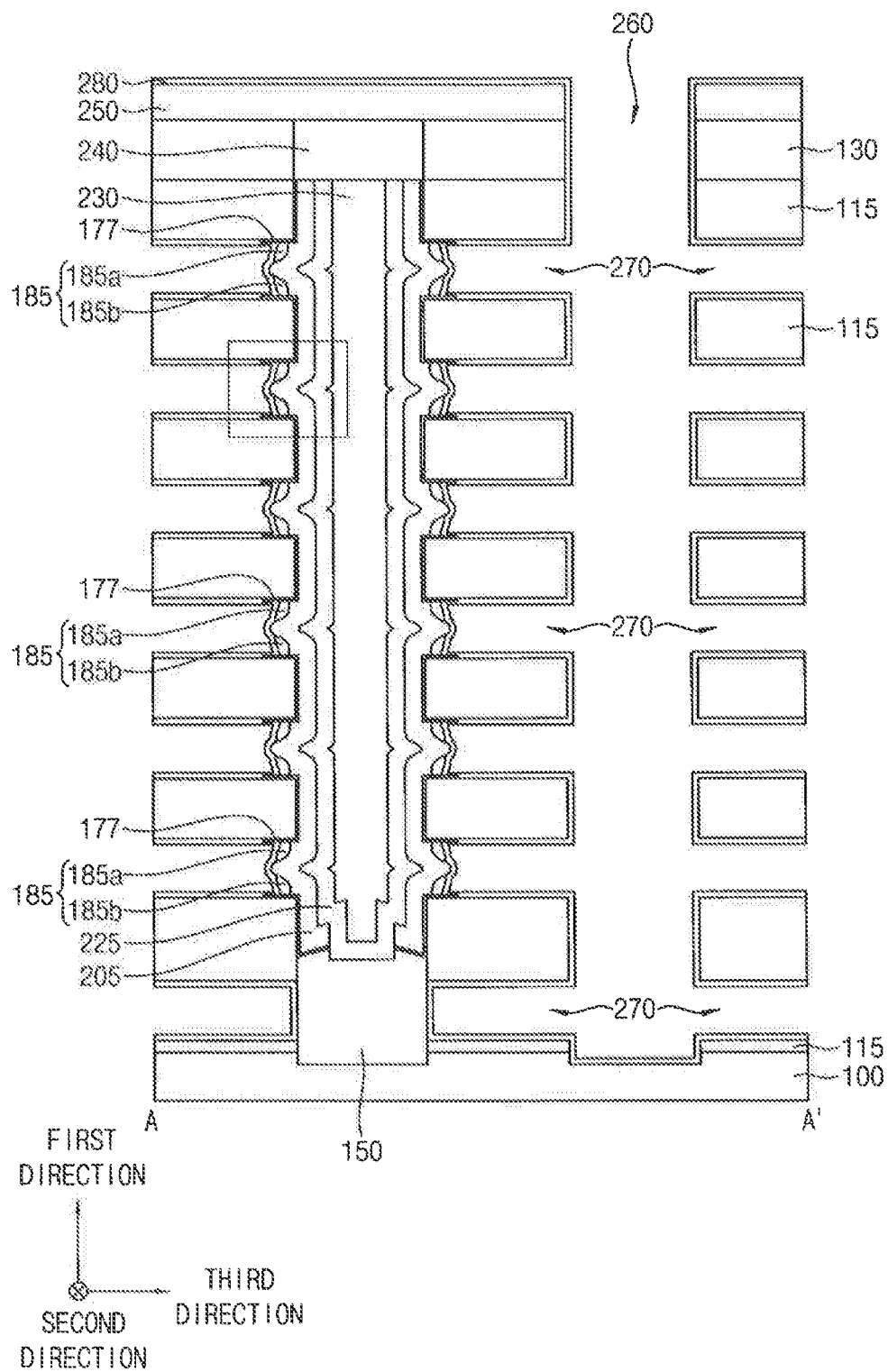
Figure 19:
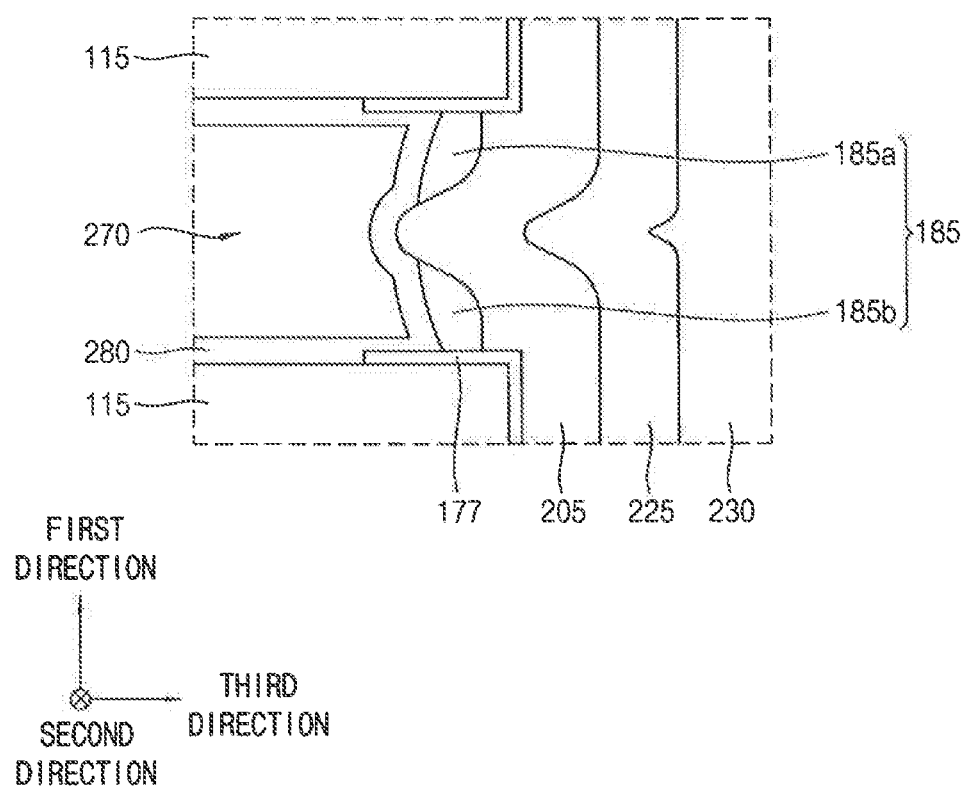

Referring to FIGS. 18 and 19, a second blocking layer 280 may be formed to cover an inner wall of the gap 270 (e.g., a sidewall adjacent the tunnel insulation pattern 205 and the lower surface and upper surface of the insulation patterns 115), a sidewall of the second opening 260, the upper surface of the substrate 100 exposed by the second opening 260, and an upper surface of the second insulating interlayer 250.

The second blocking layer 280 may cover the exposed upper surface of the substrate 100, a portion of the exposed sidewall of the semiconductor pattern 150, the exposed surface of each of the insulation patterns 115, the exposed surface of each of the first blocking patterns 177, the exposed outer sidewall of each of the charge trapping pattern structures 185, the exposed outer sidewall of each of the tunnel insulation patterns 205, a sidewall of the first insulating interlayer 130, and the upper surface of the second insulating interlayer 250.

In an exemplary embodiment, the second blocking layer 280 may be conformally formed to have a constant thickness, and may have a greater thickness than the first blocking pattern 177.

In exemplary embodiments, corresponding to shapes of the outer sidewall of the charge trapping pattern structure 185 and the outer sidewall of the tunnel insulation pattern 205, a sidewall of the second blocking layer 280 adjacent to the tunnel insulation pattern 205 between insulation patterns on upper and lower levels may have a shape in which a central portion in the first direction protrudes more than other portions along the third direction.

In the exemplary embodiment shown in FIG. 19, a lower surface exposed by the gap 270 of an upper portion of the second blocking layer 280 that contacts the insulation pattern 115 formed on the upper level (hereinafter, referred to as an upper insulation pattern 115) may be formed lower (e.g., in the first direction) than a lower surface of the first blocking pattern 177 that contacts the upper insulation pattern 115, and an upper surface exposed by the gap 270 of a lower portion of the second blocking layer 280 that contacts the lower insulation pattern 115 may be formed higher (e.g., in the third direction) than an upper surface of the first blocking pattern 177 that contacts the insulation pattern 115 formed on the lower level (hereinafter, referred to as a lower insulation pattern 115). In an exemplary embodiment, each of the lower surface of the upper portion of the second blocking layer 280 and the upper surface of the lower portion of the second blocking layer 280 may have a slope substantially parallel to the upper surface of the substrate 100.

In an exemplary embodiment, the second blocking layer 280 may have the substantially same material as the first blocking pattern 177, e.g., an oxide such as silicon oxide, and thus may be merged with the first blocking pattern 177. However, exemplary embodiments of the present inventive concepts are not limited thereto. For example, in another exemplary embodiment, the second blocking layer 280 may have a structure in which a first layer including an oxide, such as a silicon oxide, etc., and a second layer including a metal oxide, such as aluminum oxide, hafnium oxide, zirconium oxide, etc., are sequentially stacked.

Figure 20:
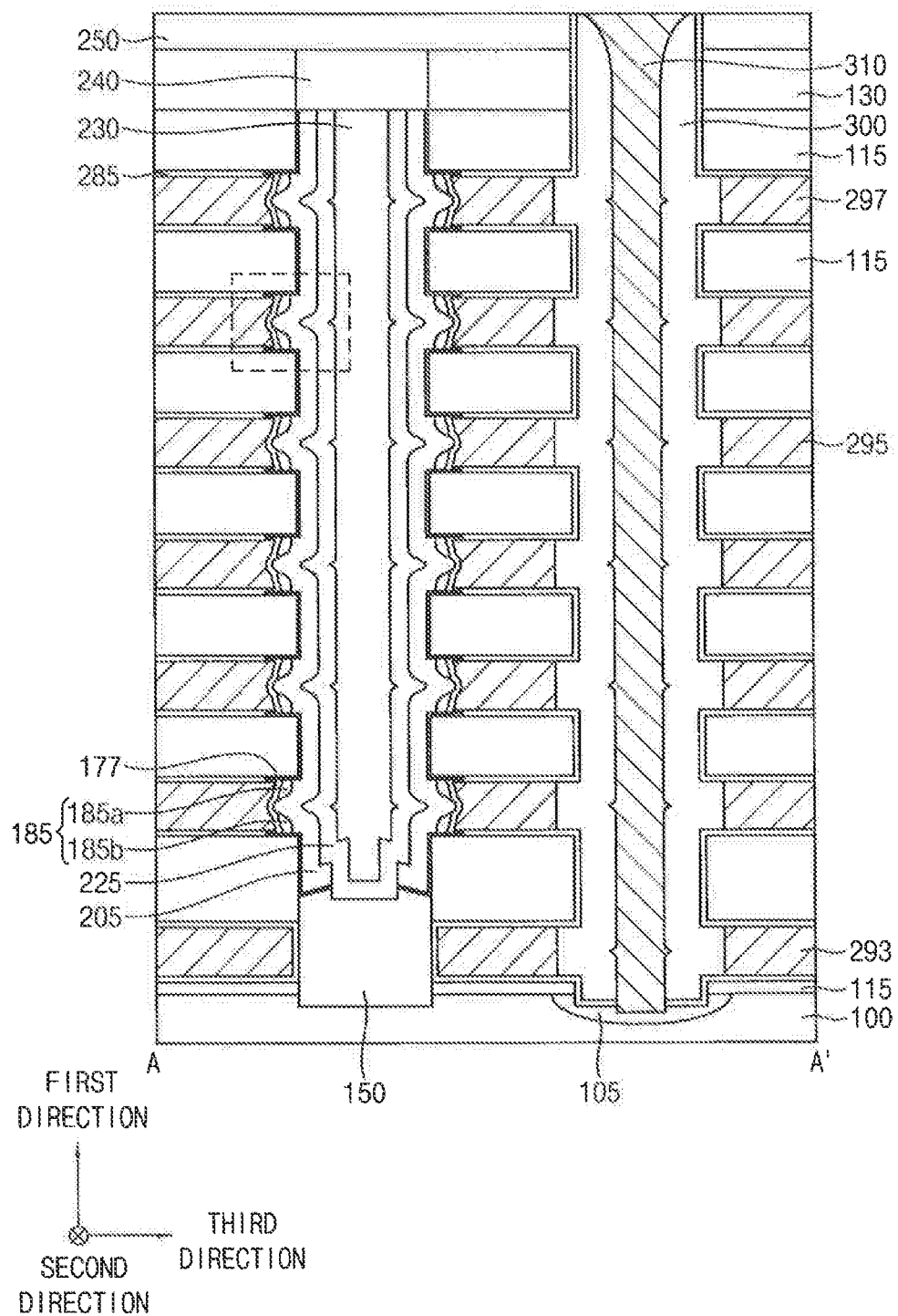
Figure 21:
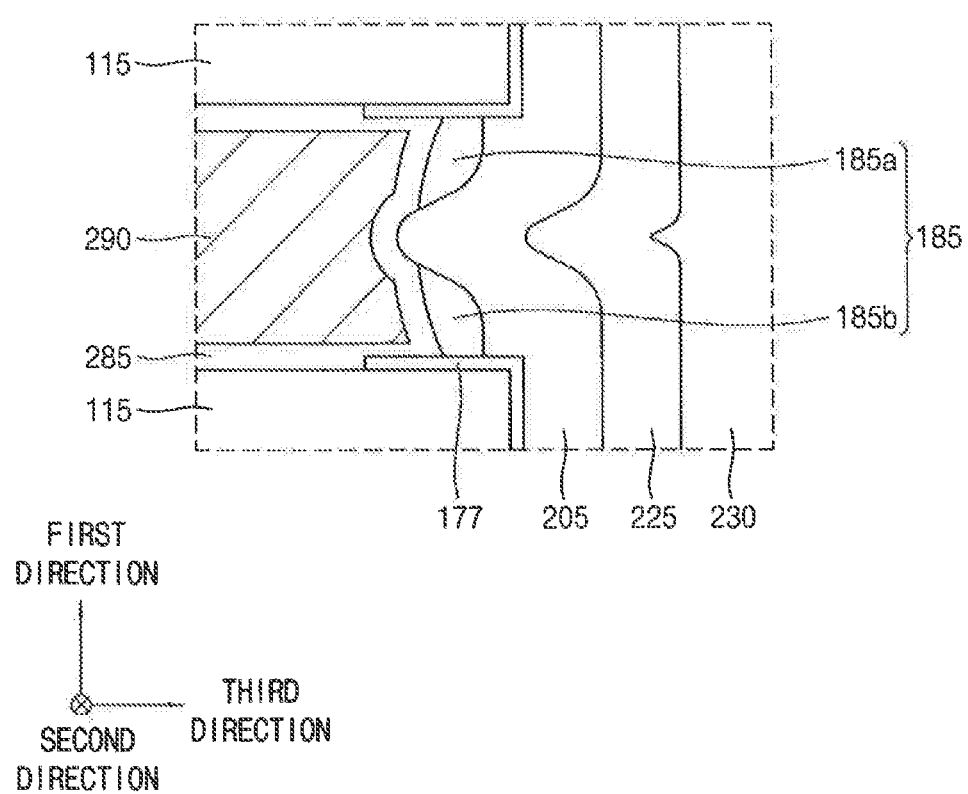

Referring to FIGS. 20 and 21, a gate electrode layer may be formed on the second blocking layer 280 to fill a remaining portion of the gap 270.

In an exemplary embodiment, the gate electrode layer may include agate barrier layer and a gate conductive layer sequentially stacked. The gate conductive layer may include a metal having low electrical resistance, e.g., tungsten, titanium, tantalum, platinum, etc., and the gate barrier layer may include a metal nitride, e.g., titanium nitride, tantalum nitride, etc. However, exemplary embodiments of the present inventive concepts are not limited thereto.

In an exemplary embodiment, an upper surface of the gate electrode layer adjacent the upper insulation pattern 115 may be formed lower than the lower surface of the first blocking pattern 177 that contacts the upper insulation pattern 115 in the first direction, and a lower surface of the gate electrode layer adjacent the lower insulation pattern 115 may be formed higher than the upper surface of the first blocking pattern 177 that contacts the lower insulation pattern 115 in the first direction. Each of the upper and lower surfaces of the gate electrode layer may have a slope substantially parallel to the upper surface of the substrate 100 (e.g., extending in the third direction).

The gate electrode layer may be partially removed to form a gate conductive pattern and a gate barrier pattern in the gap 270, and the gate conductive pattern and the gate barrier pattern altogether may form a gate electrode. In an exemplary embodiment, the gate conductive pattern and the gate barrier pattern may be partially removed by a wet etching process.

The gate electrode may extend in the second direction, and a plurality of gate electrodes may be formed along the third direction. For example, the plurality of gate electrodes extending in the second direction may be spaced apart from each other in the third direction by the second opening 260.

The gate electrode may include first to third gate electrodes 293, 295 and 297 sequentially formed along the first direction.

In an exemplary embodiment, an upper surface of the gate electrode adjacent to the upper insulation pattern 115 may be formed lower than the lower surface of the first blocking pattern 177 that contacts the upper insulation pattern 115. A lower surface of the gate electrode adjacent to the lower insulation pattern 115 may be formed higher than the upper surface of the first blocking pattern 177 that contacts the lower insulation pattern 115. Each of the upper and lower surfaces of the gate electrode may have a slope substantially parallel to the upper surface of the substrate 100 (e.g., extending in the third direction).

In an exemplary embodiment, a central portion (e.g., in the first direction) of a sidewall of the gate electrode contacting the outer sidewall of the second blocking layer 280 between the upper and lower insulation patterns 115 and being adjacent to the channel 225 (e.g., with the tunnel insulation pattern 205 and charge trapping pattern 185 therebetween) may have a shape that is concave toward the channel 225 compared to other portions of the sidewall of the gate electrode. For example, the central portion of the sidewall of the gate electrode may protrude further away from the channel 225 compared to the other portions.

In exemplary embodiments, the upper and lower charge trapping patterns 185a and 185b may be formed on a space between each of the second and third gate electrodes 295 and 297 and the tunnel insulation pattern 205. The upper surface of the upper charge trapping pattern 185a may be higher (e.g., in the third direction) than upper surfaces of the second and third gate electrodes 295 and 297 adjacent thereto. A lower surface of the lower charge trapping pattern 185b may be lower than lower surfaces of the second and third gate electrodes 295 and 297 adjacent thereto.

Impurities may be injected into the exposed upper portion of the substrate 100 to form an impurity region 105. A second spacer layer may then be formed on an upper surface of the impurity region 105, the sidewall of the second opening 260 and the upper surface of the second insulating interlayer 250. The second spacer layer may be anisotropically etched to form a second spacer 300 on the sidewall of the second opening 260. Therefore, the impurity region 105 on the upper portion of the substrate 100 may be partially exposed.

The impurities may include n-type impurities, such as phosphorous, arsenic, etc., and the second spacer layer may include an oxide, such as silicon oxide, etc.

A CSL 310 may be formed on the exposed impurity region 105 to fill a remaining portion of the second opening 260.

In exemplary embodiments, the CSL 310 may be formed by forming a conductive layer on the exposed impurity region 105, the second spacer 300 and the second insulating interlayer 250 to fill the second opening 260. An upper portion of the conductive layer may then be planarized until the upper surface of the second insulating interlayer 250 is exposed. A portion of the second blocking layer 280 formed on the upper surface of the second insulating interlayer 250 may be also removed. Therefore, the second blocking layer 280 may be converted into a second blocking pattern 285. In an exemplary embodiment, the conductive layer may include a metal, a metal nitride and/or a metal silicide.

Referring to FIGS. 1 to 3 again, after forming a third insulating interlayer 320 on the second insulating interlayer 250, the CSL 310, the second spacer 300 and the second blocking pattern 285, a contact plug 330 extending through the third insulating interlayer 320 and the second insulating interlayer 250 and contacting an upper surface of the pad 240 may be formed.

A fourth insulating interlayer 340 may be formed on the third insulating interlayer 320 and the contact plug 330. A bit line 350 that extends through the fourth insulating interlayer 340 and contacts an upper surface of the contact plug 330 may be formed to complete the fabrication of the vertical memory device.

The third and fourth insulating interlayers 320 and 340 may include oxide, such as silicon oxide, etc., and the contact plug 330 and the bit line 350 may include a metal, such as copper, aluminum, tungsten, titanium, tantalum, etc., and/or a metal nitride, such as, titanium nitride, tantalum nitride, tungsten nitride, etc.

In an exemplary embodiment, the bit line 350 may extend in the third direction, and a plurality of bit lines may be arranged along the second direction.

As described above, the charge trapping pattern structure 185 formed between each of the second to third gate electrodes 295 and 297 among the gate electrodes and the channel 225 may include the upper and lower charge trapping patterns 185a and 185b spaced apart from each other along the first direction. A plurality of charge trapping patterns may be arranged in one transistor. Therefore, the degree of integration of the vertical memory device including the transistor may be increased. Additionally, electrons may be efficiently injected into the second to third gate electrodes 295 and 297 through each of the upper and lower charge trapping patterns 185a and 185b, and thus the electrical characteristic of the vertical memory device may be improved.

As the second to third gate electrodes 295 and 297 and the insulation patterns 115 may be formed to have a concave-convex shape in the first direction as a whole, the charge trapping pattern structure 185 may be at least partially interposed between the second to third gate electrodes 295 and 297 along the first direction, so that the interference between neighboring second or third gate electrodes 295 and 297 may be minimized. Therefore, coupling between the second electrodes 295 serving as word lines may be reduced.

Figure 22:
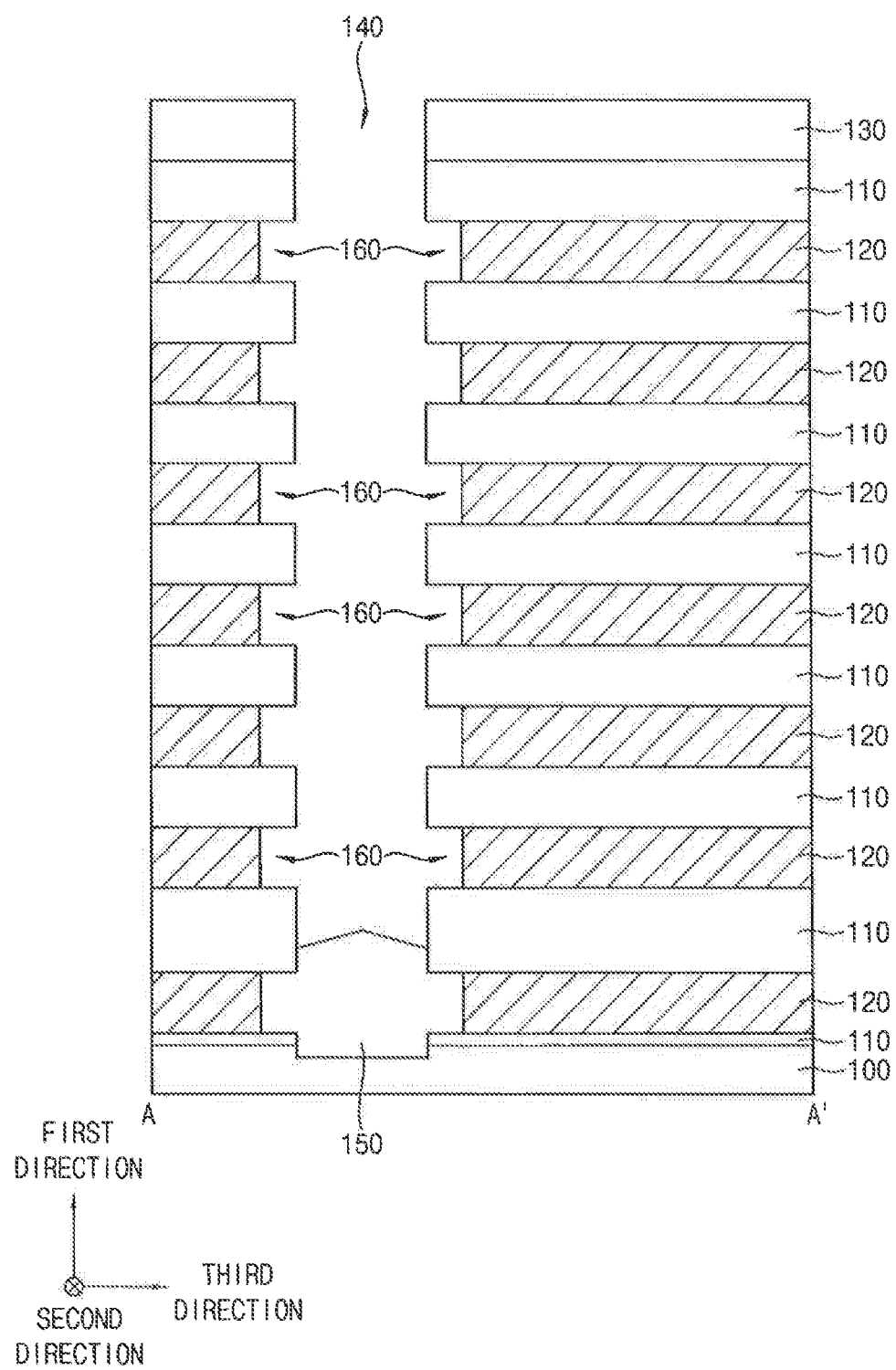
FIGS. 22-24 are cross-sectional views taken along line A-A' of FIG. 1, illustrating stages of a method of manufacturing a vertical memory device in accordance with exemplary embodiments of the present inventive concepts.
Figure 23:
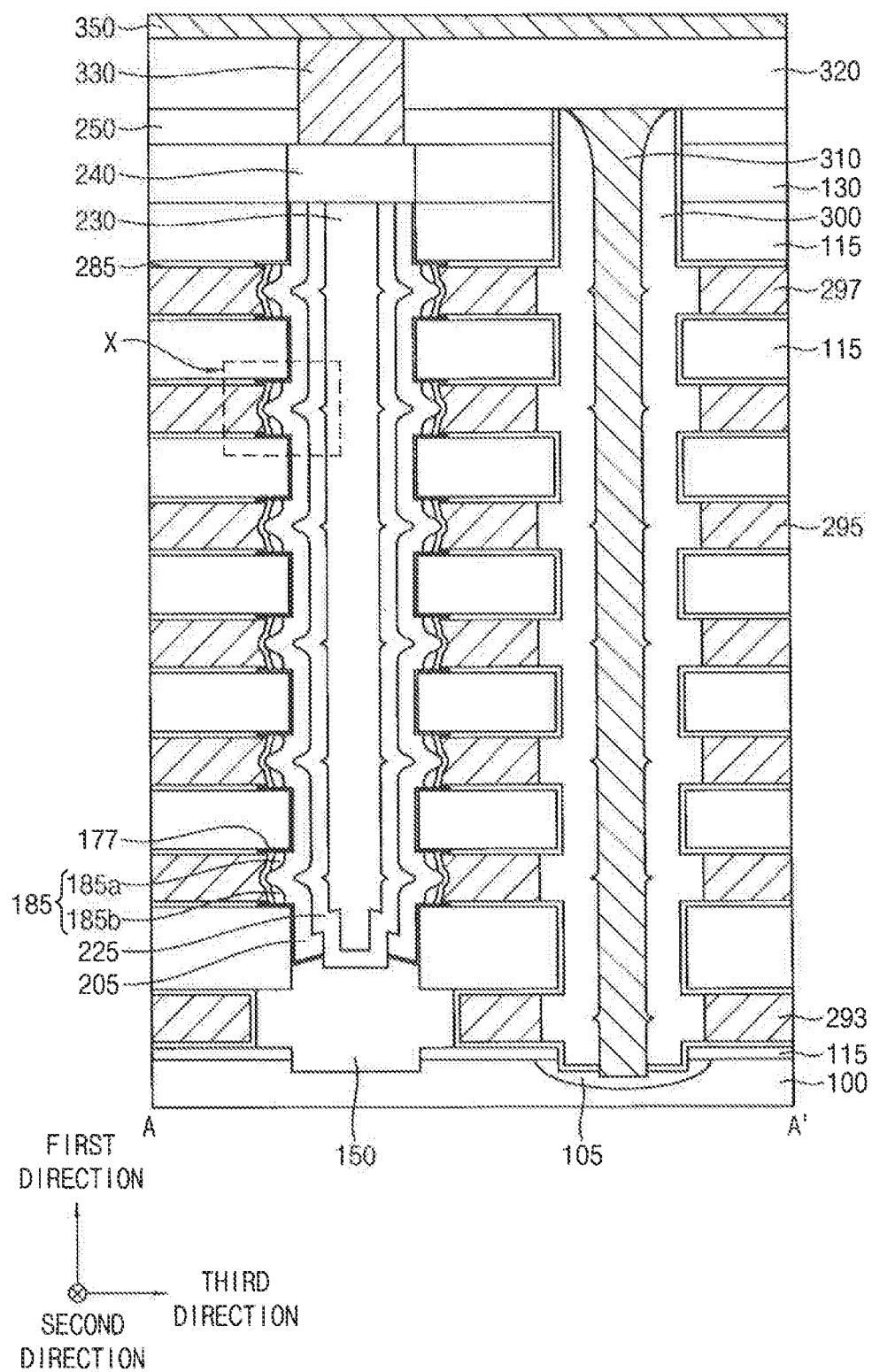

FIGS. 22 and 23 are cross-sectional views illustrating stages of a method of manufacturing a vertical memory device in accordance with exemplary embodiments of the present inventive concepts. FIGS. 22 and 23 are cross-sectional views taken along the line A-A' of FIG. 1.

The method of manufacturing the vertical memory device includes processes substantially the same as or similar to the processes described in FIGS. 4 to 21 and FIGS. 1 to 3. Thus, detailed descriptions thereon are omitted herein.

Referring to FIG. 22, processes substantially the same as or similar to the processes described in FIGS. 4 to 6 may be performed.

However, before forming the semiconductor pattern 150, sidewalls of the sacrificial layers exposed by the channel hole 140 may be partially removed to form the first recesses 160.

Accordingly, the first recesses 160 may be formed on all of the sacrificial layers 120 including the lowermost sacrificial layer, and the semiconductor pattern 150 may be formed to fill the first recess 160 that may be formed on the lowermost sacrificial layer 120.

An upper portion and a lower portion of the semiconductor pattern 150 may have substantially the same width. However, at least a central portion may have a greater width than each of the upper and lower portions. Therefore a sidewall of semiconductor pattern 150 may have a shape in which a central portion in the first direction protrudes further toward the sacrificial layers 120 compared to other portions. For example, the central portion of the sidewalls of the semiconductor pattern 150 may protrude further toward the sacrificial layers 120 in an amount equal to a width of the first recesses 160. In an exemplary embodiment, an air gap may be formed on the central portion of the semiconductor pattern 150.

Referring to FIG. 23, processes substantially the same as or similar to the processes described in FIGS. 8 to 21 and FIGS. 1 to 3 may be performed to complete the fabrication of the vertical memory device.

Figure 24:
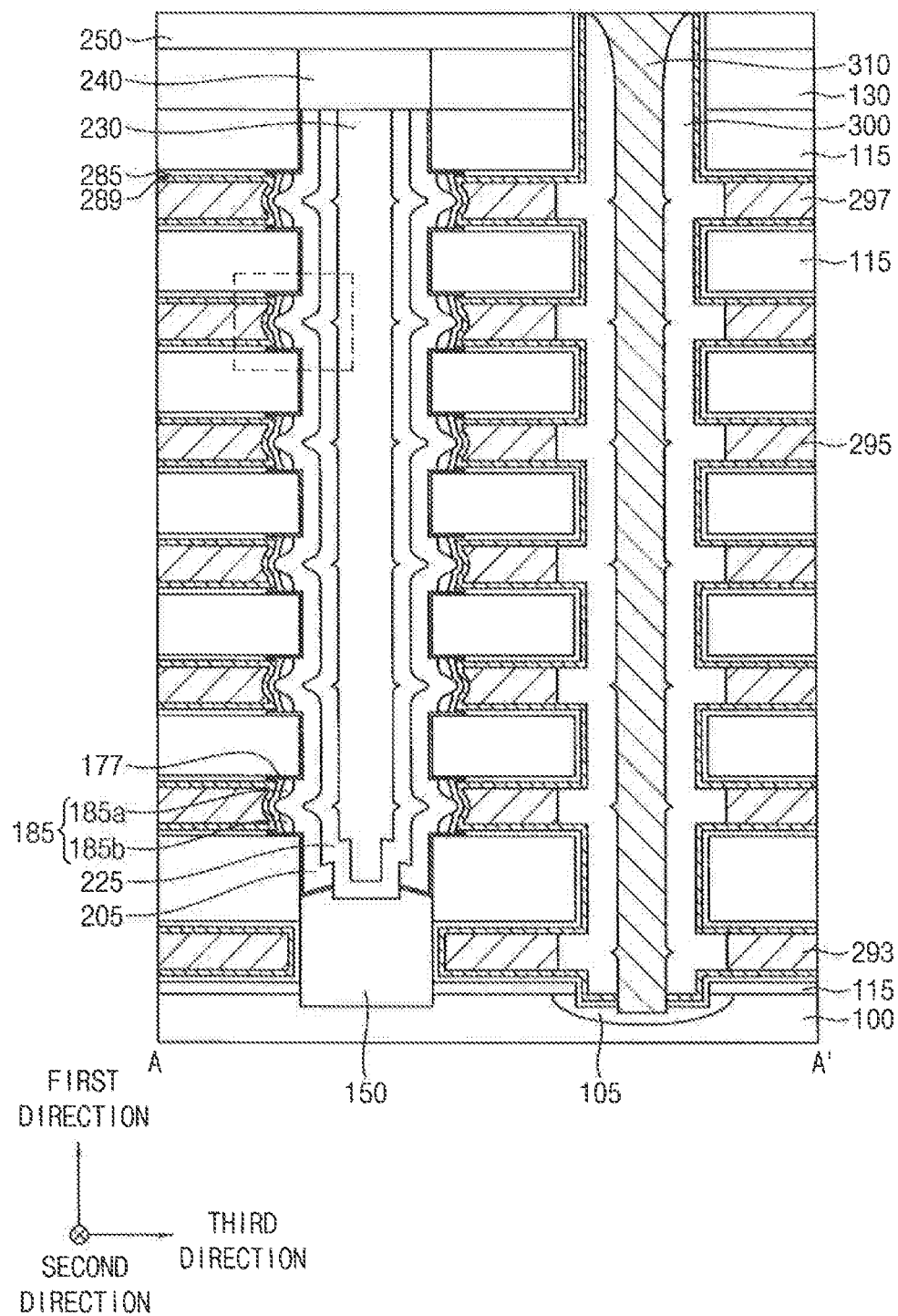
Figure 25:
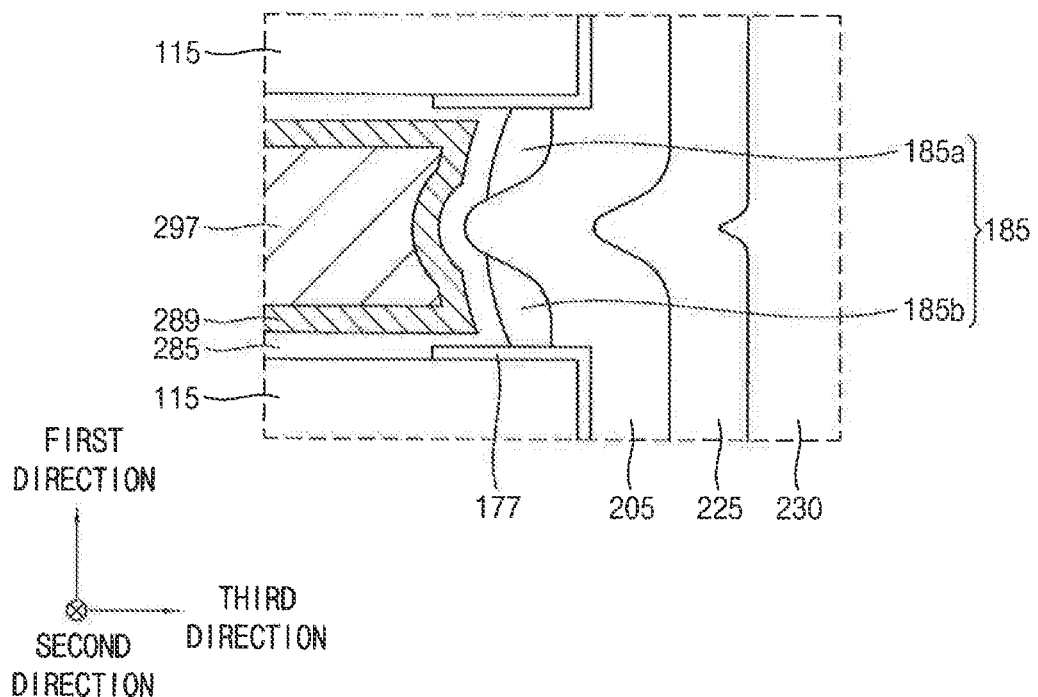
FIGS. 25-29 are enlarged cross-sectional views illustrating stages of a method of manufacturing a vertical memory device in accordance with exemplary embodiments of the present inventive concepts.

FIGS. 24 and 25 are cross-sectional views illustrating stages of a method of manufacturing a vertical memory device in accordance with exemplary embodiments of the present inventive concepts. FIG. 24 is a cross-sectional view taken along the line A-A' of FIG. 1, and FIG. 25 is an enlarged cross-sectional view of a region X in a corresponding cross-sectional view.

The method of manufacturing the vertical memory device includes processes substantially the same as or similar to the processes described in FIGS. 4 to 21 and FIGS. 1 to 3. Thus, detailed descriptions thereon are omitted herein.

Referring to FIGS. 24 and 25, the vertical memory device may further include a third blocking pattern 289 formed between the second blocking pattern 285 and the gate electrode 297. The third blocking pattern 289 may cover the gate electrode, upper and lower surfaces of the gate electrode, and one sidewall of the gate electrode.

In an exemplary embodiment, the third blocking pattern 289 may be also formed between the second blocking pattern 285 and the second spacer 300.

In an exemplary embodiment, the third blocking pattern 289 may be conformally formed to have a constant thickness. In an exemplary embodiment, a thickness of the third blocking pattern 289 may be substantially the same as a thickness of the second blocking pattern 285, and may be greater than a thickness of the first blocking pattern 177.

The third blocking pattern 289 may include a metal oxide, such as aluminum oxide, hafnium oxide, zirconium oxide, etc.

Figure 26:
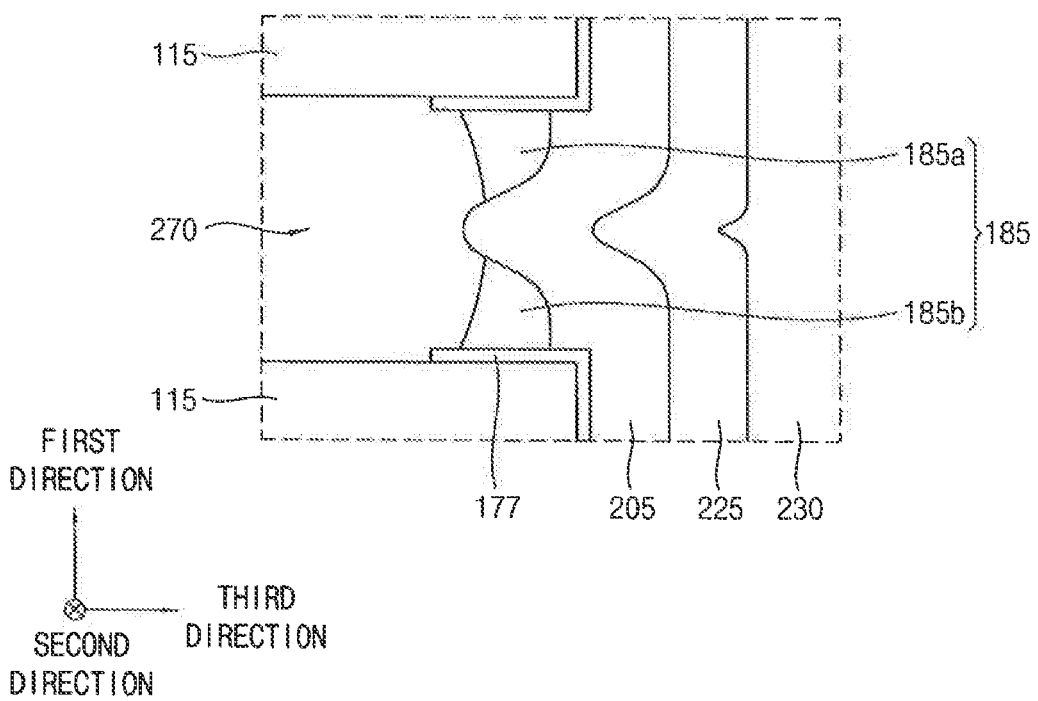
Figure 27:
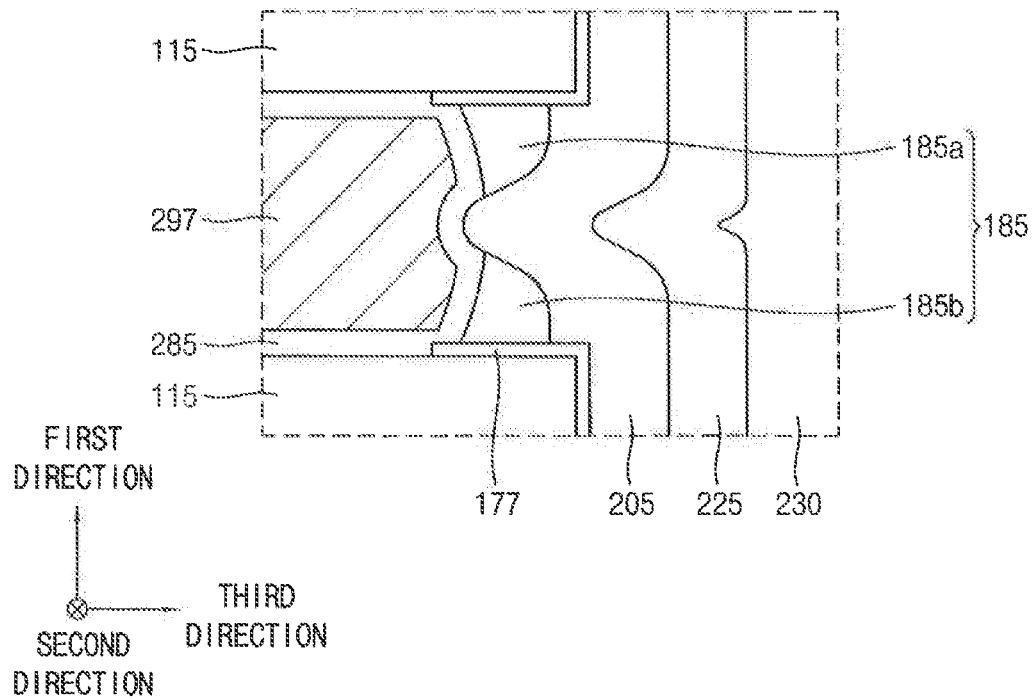

FIGS. 26 and 27 are cross-sectional views illustrating stages of a method of manufacturing a vertical memory device in accordance with an exemplary embodiment of the present inventive concepts. FIG. 26 is an enlarged cross-sectional view of the region X in FIG. 2, and FIG. 27 is an enlarged cross-sectional view of the region X in FIG. 2.

The method of manufacturing the vertical memory device includes processes substantially the same as or similar to the processes described in FIGS. 4 to 21 and FIGS. 1 to 3. Thus, detailed descriptions thereon are omitted herein.

Referring to FIG. 26, processes substantially the same as or similar to the processes described in FIGS. 4 to 17 may be performed.

However, when etching the preliminary first blocking pattern 175 exposed by the gap 270 to expose the outer sidewall of the charge trapping layer 180, and then partially etching the exposed outer sidewall of the charge trapping layer 180 to form the first blocking pattern 177 and the charge trapping pattern structure 185, the etching process may be performed to a greater extent on a central portion in the first direction than other portions of the outer sidewall of the charge trapping layer 180. Therefore, the charge pattern structure may be etched to a greater extent as the charge pattern structure gets closer to a portion of the outer sidewall of the tunnel insulation pattern 205 that has a shape more protruding from the channel 225 along the third direction. For example, the charge pattern structure 185 may be etched to a greater extent as it gets closer to the middle portion of the charge pattern structure in the first direction.

In an exemplary embodiment, the outer sidewall of the tunnel insulation pattern 205 may protrude from the channel 225 along the third direction more than a lower portion of the outer sidewall of the upper charge trapping pattern 185a and an upper portion of the outer sidewall of the lower charge trapping pattern 185b.

In an exemplary embodiment, the outer sidewall of the upper charge trapping pattern 185a may have a slope that decreases toward the top, and the outer sidewall of the lower charge trapping pattern 185b may have a slope that decreases toward the bottom.

Referring to FIG. 27, processes substantially the same as or similar to the processes described in FIGS. 18 to 21 and FIGS. 1 to 3 may be performed to complete the fabrication of the vertical memory device.

The sidewall of the second blocking pattern 285 adjacent to the channel 225, and the sidewalls of each of the second and third gate electrodes 295 and 297 adjacent to the channel 225 may have shapes corresponding to the outer sidewall of the tunnel insulation pattern 205, and the outer sidewall of the charge trapping pattern structure 185. For example, the middle portions (e.g., in the first direction) of the second blocking pattern 285, second electrodes 295 and third electrodes 297 may have a concave shape in the third direction toward the channel 225.

Figure 28:
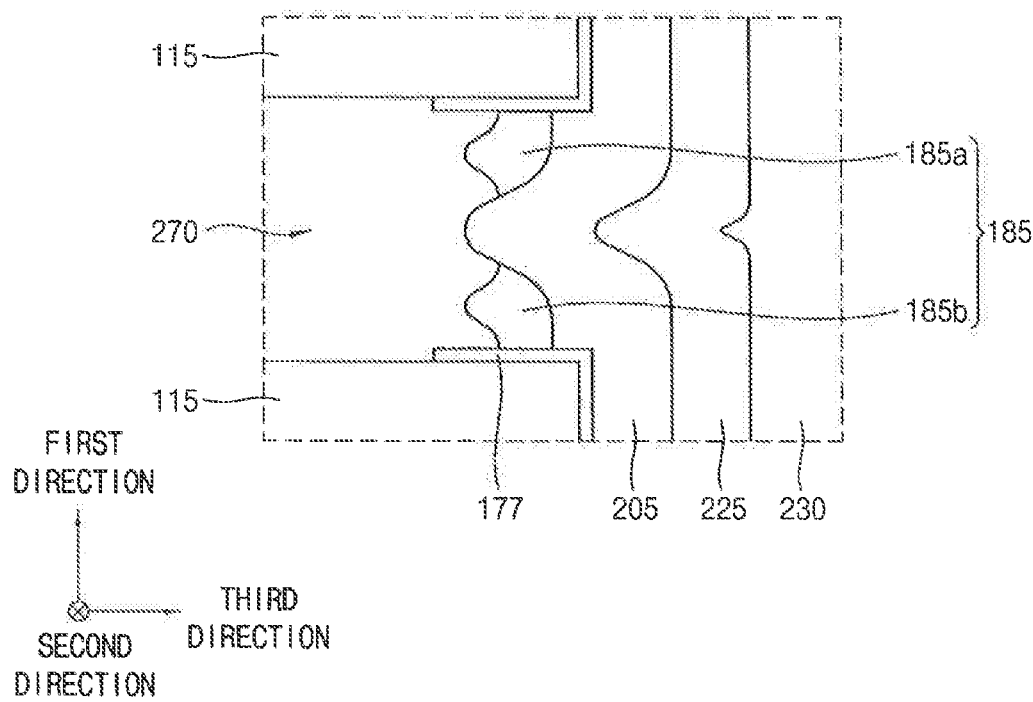
Figure 29:
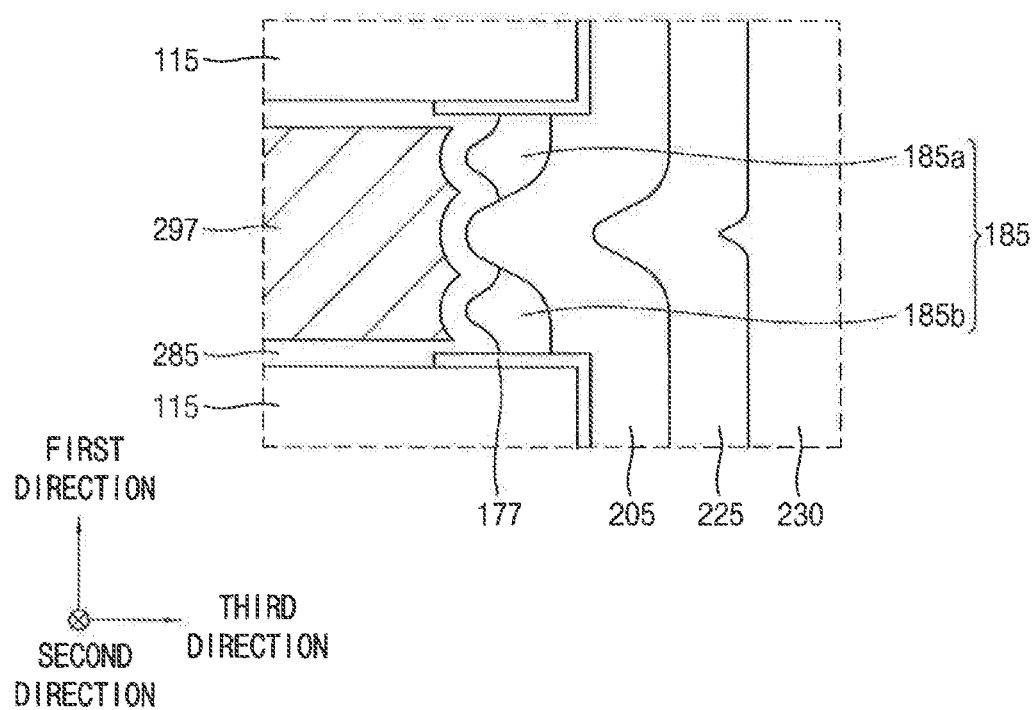

FIGS. 28 and 29 are cross-sectional views illustrating stages of a method of manufacturing a vertical memory device in accordance with exemplary embodiments of the present inventive concepts. FIG. 28 is an enlarged cross-sectional view of the region X in FIG. 20. FIG. 29 is an enlarged cross-sectional view of the region X in FIG. 2.

The method of manufacturing the vertical memory device includes processes substantially the same as or similar to the processes described in FIGS. 4 to 21 and FIGS. 1 to 3. Thus, detailed descriptions thereon are omitted herein.

Referring to FIG. 28, processes substantially the same as or similar to the processes described in FIGS. 4 to 17 may be performed.

However, when etching the preliminary first blocking pattern 175 exposed by the gap 270 to expose the outer sidewall of the charge trapping layer 180, and then partially etching the exposed outer sidewall of the charge trapping layer 180 to form the first blocking pattern 177 and the charge trapping pattern structure 185, the etching process may be performed to a greater extent on an upper portion, a lower portion and a central portion in the first direction of the charge trapping layer 180. The etching process may be performed to a lesser extent on each of a first portion of the outer sidewall of the upper charge trapping pattern 185a disposed between an upper portion and a lower portion thereof and a second portion of the outer sidewall of the lower charge trapping pattern 185b disposed between an upper portion and a lower portion thereof. Therefore, the charge trapping pattern structure 185 including the upper and lower charge trapping patterns 185a and 185b may have a curved shape as a whole.

In an exemplary embodiment, the outer sidewall (e.g., a sidewall farthest from the channel 225) of the tunnel insulation pattern 205 may protrude from the channel 225 along the third direction more than each of the upper portion and the lower portion of the outer sidewall of the upper charge trapping pattern 185a, and each of the upper portion and the lower portion of the outer sidewall of the lower charge trapping pattern 185b. However, in other exemplary embodiments, the outer sidewall of the tunnel insulation pattern 205 may protrude less than the first portion of the upper charge trapping pattern 185a and the second portion of the lower charge trapping pattern 185b. In the exemplary embodiment shown in FIG. 28, the outer sidewall of the tunnel insulation pattern protrudes to a substantially same point in the third direction as the protrusions of the upper charge trapping pattern 185a and lower charge trapping pattern 185b.

In an exemplary embodiment, the outer sidewall of the charge trapping pattern structure 185 may have a slope that is not vertical (e.g., perpendicular) but varies (e.g., extends in the third direction) with respect to the upper surface of the substrate 100.

In an exemplary embodiment, a thickness of the upper charge trapping pattern 185a in the third direction may be greatest at the first portion of the upper charge trapping pattern 185a, and a thickness of the lower charge trapping pattern 185b in the third direction may be greatest at the second portion of the lower charge trapping pattern 185b.

Referring to FIG. 29, processes substantially the same as or similar to the processes described in FIGS. 18 to 21 and FIGS. 1 to 3 may be performed to complete the fabrication of the vertical memory device.

The sidewall of the second blocking pattern 285 adjacent to the channel 225, and the sidewalls of each of the second and third gate electrodes 295 and 297 adjacent to the channel 225 may have shapes corresponding to the outer sidewall of the tunnel insulation pattern 205, and the outer sidewall of the charge trapping pattern structure 185.

For example, the sidewall of the second blocking pattern 285 and the sidewalls of each of the second and third gate electrodes 295 and 297 may have slopes that are not vertical (e.g., perpendicular), but varying (e.g., extending in the third direction) with respect to the upper surface of the substrate 100, respectively.

In exemplary embodiments, the sidewalls of each of the second and third gate electrodes 295 and 297 adjacent to the channel 225 in the third direction may have a wave shape toward the channel 225 as a whole.

As described above, although the present invention has been described with reference to exemplary embodiments, those skilled in the art will readily appreciate that many modifications are possible in the exemplary embodiments without materially departing from the novel teachings and advantages of the present inventive concepts.

What is claimed is:

1. A vertical memory device, comprising:
   gate electrodes on a substrate, the gate electrodes spaced apart from each other in a vertical direction that is substantially perpendicular to an upper surface of the substrate;
   a channel penetrating the gate electrodes and extending in the vertical direction;
   a tunnel insulation pattern formed on an outer sidewall of the channel;
   a charge trapping pattern structure formed on an outer sidewall of the tunnel insulation pattern adjacent the gate electrodes in a horizontal direction that is substantially parallel to the upper surface of the substrate, the charge trapping pattern structure including upper and lower charge trapping patterns; and
   a blocking pattern formed between the charge trapping pattern structure and each of the gate electrodes adjacent to the charge trapping pattern structure,
   wherein an upper surface of the upper charge trapping pattern is higher than an upper surface of a gate electrode adjacent to the charge trapping pattern structure, and
   wherein a lower surface of the lower charge trapping pattern is lower than a lower surface of a gate electrode adjacent to the charge trapping structure.

2. The vertical memory device of claim 1, wherein a thickness of the upper charge trapping pattern in the horizontal direction decreases from a top portion toward a bottom portion and a thickness of the lower charge trapping pattern in the horizontal direction increases from a top portion toward a bottom portion.

3. The vertical memory device of claim 1, wherein the blocking pattern covers the upper surface and the lower surface of each of the gate electrodes.

4. The vertical memory device of claim 1, wherein:
   the blocking pattern is a second blocking pattern; and
   the vertical memory device further includes a first blocking pattern covering the upper surface of the upper charge trapping pattern and the lower surface of the lower charge trapping pattern.

5. The vertical memory device of claim 4, wherein the second blocking pattern has a thickness in the vertical direction that is greater than a thickness of the first blocking pattern.

6. The vertical memory device of claim 1, wherein:
   the upper and lower charge trapping patterns are spaced apart from each other in the vertical direction by a portion of the tunnel insulation pattern; and
   the tunnel insulation pattern includes a protrusion that protrudes from the channel in the horizontal direction.

7. The vertical memory device of claim 6, wherein the blocking pattern contacts the protrusion of the tunnel insulation pattern, and has a convex shape toward each of the gate electrodes.

8. The vertical memory device of claim 1, wherein a sidewall of each of the gate electrodes that is adjacent to the channel in the horizontal direction has a concave shape or a convex shape toward the channel.

9. The vertical memory device of claim 1, wherein a sidewall of each of the gate electrodes that is adjacent to the channel in the horizontal direction has a wave shape toward the channel.

10. A vertical memory device, comprising:
gate electrodes on a substrate, the gate electrodes spaced apart from each other in a vertical direction that is substantially perpendicular to an upper surface of the substrate;
a channel penetrating the gate electrodes and extending in the vertical direction;
a tunnel insulation pattern formed on an outer sidewall of the channel;
a charge trapping pattern structure formed on an outer sidewall of the tunnel insulation pattern adjacent the gate electrodes in a horizontal direction that is substantially parallel to the upper surface of the substrate, the charge trapping pattern structure including upper and lower charge trapping patterns; and
a blocking pattern formed between the charge trapping pattern structure and each of the gate electrodes adjacent to the charge trapping pattern structure, wherein the blocking pattern covers an upper surface and a lower surface of each of the gate electrodes.

11. The vertical memory device of claim 10, wherein the blocking pattern covers an upper surface of the upper charge trapping pattern and a lower surface of the lower charge trapping pattern.

12. The vertical memory device of claim 11, wherein a portion of the blocking pattern covering the upper surface and the lower surface of each of the gate electrodes has a thickness that is greater than a thickness of a portion of the blocking pattern covering the upper surface of the upper charge trapping pattern and the lower surface of the lower charge trapping pattern.

13. The vertical memory device of claim 10, wherein a thickness of the upper charge trapping pattern in the horizontal direction decreases from a top portion toward a bottom portion, and a thickness of the lower charge trapping pattern in the horizontal direction increases from a top portion toward a bottom portion.

14. The vertical memory device of claim 10, wherein the tunnel insulation pattern includes a protrusion that protrudes in the horizontal direction, wherein the upper and lower charge trapping patterns are spaced apart from each other in the vertical direction by the protrusion.

15. The vertical memory device of claim 14, wherein the blocking pattern contacts the protrusion of the tunnel insulation pattern, and has a convex shape toward each of the gate electrodes.

16. A vertical memory device, comprising:
gate electrodes on a substrate, the gate electrodes spaced apart from each other in a vertical direction that is substantially perpendicular to an upper surface of the substrate;
a channel penetrating the gate electrodes and extending in the vertical direction;
a tunnel insulation pattern formed on an outer sidewall of the channel, the tunnel insulation pattern including a protrusion that protrudes in a horizontal direction that is substantially parallel to the upper surface of the substrate;
a charge trapping pattern structure formed on an outer sidewall of the tunnel insulation pattern that is adjacent the gate electrodes in the horizontal direction, the charge trapping pattern structure including upper and lower charge trapping patterns that are spaced apart from each other in the vertical direction by the protrusion of the tunnel insulation pattern; and
a blocking pattern having a concave shape toward each of the gate electrodes, the concave shape corresponding to the protrusion of the tunnel insulation pattern.

17. The vertical memory device of claim 16, wherein a thickness of the upper charge trapping pattern in the horizontal direction decreases from a top portion toward a bottom portion, and a thickness of the lower charge trapping pattern in the horizontal direction increases from a top portion toward a bottom portion.

18. The vertical memory device of claim 16, wherein the blocking pattern covers an upper surface and a lower surface of each of the gate electrodes.

19. The vertical memory device of claim 18, wherein the blocking pattern covers an upper surface of the upper charge trapping pattern and a lower surface of the lower charge trapping pattern.

20. The vertical memory device of claim 19, wherein a portion of the blocking pattern covering the upper surface and the lower surface of each of the gate electrodes has a thickness that is greater than a thickness of a portion of the blocking pattern covering the upper surface of the upper charge trapping pattern and the lower surface of the lower charge trapping pattern.

* * * * *